United States Patent
Cheng et al.

(10) Patent No.: US 12,009,256 B2
(45) Date of Patent: Jun. 11, 2024

(54) REDISTRIBUTION LINES WITH PROTECTION LAYERS AND METHOD FORMING SAME

(71) Applicant: Taiwan Semiconductor Manufacturing Co., Ltd., Hsinchu (TW)

(72) Inventors: Ming-Da Cheng, Taoyuan (TW); Wen-Hsiung Lu, Tainan (TW); Chin Wei Kang, Tainan (TW); Yung-Han Chuang, Tainan (TW); Lung-Kai Mao, Kaohsiung (TW); Yung-Sheng Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/338,095

(22) Filed: Jun. 20, 2023

(65) Prior Publication Data

US 2023/0352342 A1 Nov. 2, 2023

Related U.S. Application Data

(63) Continuation of application No. 17/809,957, filed on Jun. 30, 2022, now Pat. No. 11,721,579, which is a
(Continued)

(51) Int. Cl.
*H01L 21/768* (2006.01)
*H01L 23/00* (2006.01)

(52) U.S. Cl.
CPC .. *H01L 21/76885* (2013.01); *H01L 21/76802* (2013.01); *H01L 21/76852* (2013.01); *H01L 21/76871* (2013.01); *H01L 24/05* (2013.01); *H01L 24/13* (2013.01); *H01L 24/32* (2013.01); *H01L 2224/0231* (2013.01); *H01L 2224/02331* (2013.01); *H01L 2224/0235* (2013.01);
(Continued)

(58) Field of Classification Search
CPC .................................................. H01L 21/76885
See application file for complete search history.

(56) References Cited

U.S. PATENT DOCUMENTS

| 7,566,650 B2 * | 7/2009 | Lin | H01L 24/11 |
| | | | 438/618 |
| 7,825,511 B2 * | 11/2010 | Daubenspeck | H01L 24/03 |
| | | | 257/737 |

(Continued)

FOREIGN PATENT DOCUMENTS

| CN | 102005417 A | 4/2011 |
| CN | 104051384 A | 9/2014 |

(Continued)

*Primary Examiner* — William A Harriston
(74) *Attorney, Agent, or Firm* — Slater Matsil, LLP

(57) ABSTRACT

A method includes forming a metal seed layer over a first conductive feature of a wafer, forming a patterned photo resist on the metal seed layer, forming a second conductive feature in an opening in the patterned photo resist, and heating the wafer to generate a gap between the second conductive feature and the patterned photo resist. A protection layer is plated on the second conductive feature. The method further includes removing the patterned photo resist, and etching the metal seed layer.

20 Claims, 22 Drawing Sheets

Related U.S. Application Data continuation of application No. 17/085,619, filed on Oct. 30, 2020, now Pat. No. 11,387,143.

(60) Provisional application No. 63/030,637, filed on May 27, 2020.

(52) U.S. Cl.
CPC ............ *H01L 2224/0239* (2013.01); *H01L 2224/0391* (2013.01); *H01L 2224/0401* (2013.01); *H01L 2224/05008* (2013.01); *H01L 2224/05022* (2013.01)

(56) References Cited

U.S. PATENT DOCUMENTS

| | | | |
|---|---|---|---|
| 9,214,428 B2 | 12/2015 | Liu et al. | |
| 10,192,755 B2 | 1/2019 | Matsumoto et al. | |
| 2002/0060904 A1 | 5/2002 | Higuchi | |
| 2003/0134496 A1 | 7/2003 | Lee et al. | |
| 2003/0134510 A1 | 7/2003 | Lee et al. | |
| 2006/0141773 A1 | 6/2006 | Kim | |
| 2008/0157341 A1* | 7/2008 | Yang | H01L 23/467 257/E21.507 |
| 2008/0157396 A1* | 7/2008 | Yang | H01L 24/97 257/778 |
| 2008/0309581 A1 | 12/2008 | Fujii | |
| 2009/0200073 A1 | 8/2009 | Mano | |
| 2009/0283914 A1 | 11/2009 | Murayama | |
| 2009/0297785 A1 | 12/2009 | Ueda | |
| 2010/0059853 A1* | 3/2010 | Lin | H01L 27/016 257/528 |
| 2011/0049705 A1* | 3/2011 | Liu | H01L 24/11 257/737 |
| 2012/0193787 A1 | 8/2012 | Maitani | |
| 2014/0103526 A1* | 4/2014 | Liu | H01L 23/53228 257/737 |
| 2014/0124928 A1 | 5/2014 | Lin et al. | |
| 2016/0005707 A1 | 1/2016 | Kwon et al. | |
| 2016/0181184 A1 | 6/2016 | Matsumoto et al. | |
| 2018/0102391 A1 | 4/2018 | Paik et al. | |
| 2021/0265306 A1* | 8/2021 | Wu | H01L 25/50 |

FOREIGN PATENT DOCUMENTS

| | | |
|---|---|---|
| CN | 105720027 A | 6/2016 |
| JP | H06302620 A | 10/1994 |

\* cited by examiner

REDISTRIBUTION LINES WITH PROTECTION LAYERS AND METHOD FORMING SAME

PRIORITY CLAIM AND CROSS-REFERENCE

This application is a continuation of U.S. patent application Ser. No. 17/809,957, entitled "Redistribution Lines with Protection Layers and Method Forming Same," filed Jun. 30, 2022, which is a continuation of U.S. patent application Ser. No. 17/085,619, entitled "Redistribution Lines with Protection Layers and Method Forming Same," filed Oct. 30, 2020, now U.S. Pat. No. 11,387,143, issued Jul. 12, 2022, which claims the benefit of the U.S. Provisional Application No. 63/030,637, entitled "Semiconductor Package Having Protective Layer on Metal Interconnect," filed on May 27, 2020, which applications are hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line may then be formed to connect to the top surface of the metal pad, followed by the formation of a second polymer layer over the redistribution line. An Under-Bump-Metallurgy (UBM) is formed extending into an opening in the second polymer layer, wherein the UBM is electrically connected to the redistribution line. A solder ball may be placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
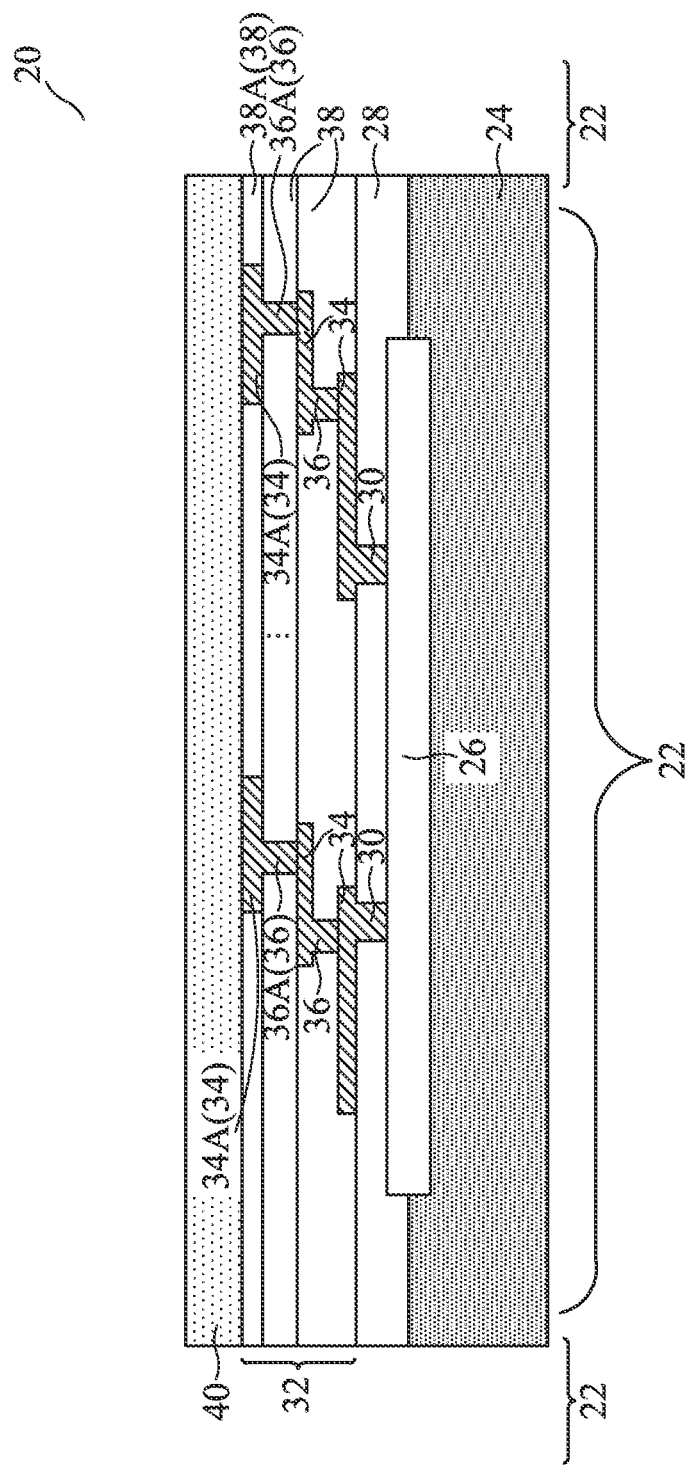
FIGS. 1 through 16 illustrate the cross-sectional views of intermediate stages in the formation of a device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device and the method of forming the same are provided in accordance with some embodiments. The device includes a redistribution line, which includes a conductive feature and a conductive protection layer on the conductive feature. The formation process may include forming a patterned photo resist on a wafer and plating the conductive feature in the patterned photo resist. The wafer is then heated, so that the photo resist shrinks, resulting in a gap between the patterned photo resist and the conductive feature. A plating process may then be performed to plate the protection layer. The intermediate stages in the formation of the package are illustrated in accordance with some embodiments. Some variations of some embodiments are discussed. Throughout the various views and illustrative embodiments, like reference numbers are used to designate like elements.

Figure 20:
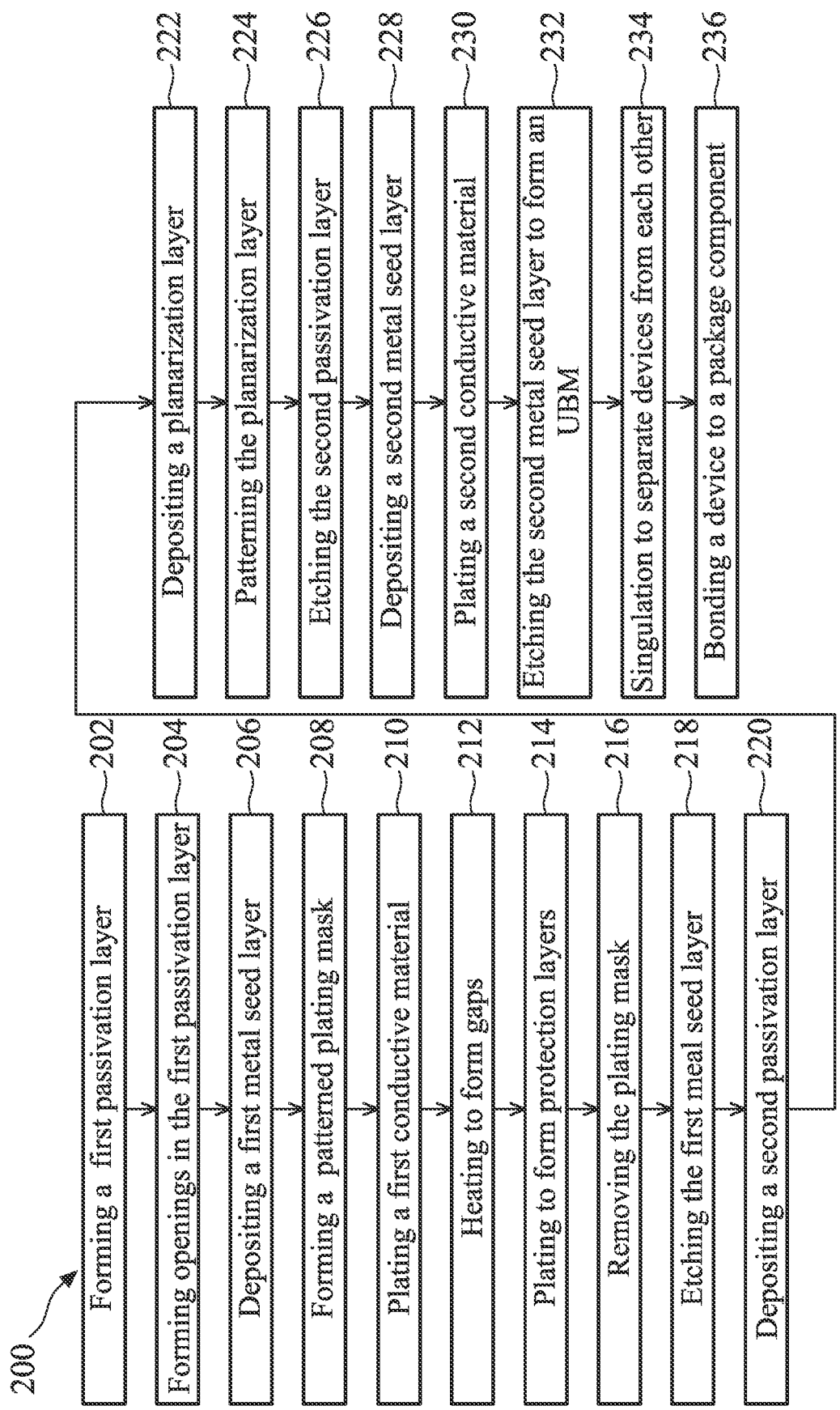
FIG. 20 illustrates a process flow for forming a device in accordance with some embodiments.

FIGS. 1 through 16 illustrate the cross-sectional views of intermediate stages in the formation of a device in accordance with some embodiments of the present disclosure. The corresponding processes are also reflected schematically in the process flow 200 as shown in FIG. 20. It is appreciated that although a device wafer and a device die are used as examples, the embodiments of the present disclosure may also be applied on the formation of conductive lines in other devices (package components) including, and not limited to, package substrates, interposers, packages, and the like.

FIG. 1 illustrates a cross-sectional view of integrated circuit device 20. In accordance with some embodiments of the present disclosure, device 20 is or comprises a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is an interposer wafer, which may or may not include active devices and/or passive devices. In accordance with yet alternative embodiments of the present disclosure, device 20 is or comprises a package substrate strip, which includes a core-less package substrate or a cored package substrate with a core therein. In subsequent discussion, a device wafer is used as an example of device 20, and device 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the space between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), Tetra Ethyl Ortho Silicate (TEOS), or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys therefore, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a Chemical Mechanical Polish (CMP) process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads, or vias (denoted as 34A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a top dielectric layer. The top dielectric layer 38A and the underlying dielectric layer 38 that is immediately underlying the top dielectric layer 38A may be formed as a single continuous dielectric layer, or may be formed as different dielectric layers using different processes, and/or formed of materials different from each other.

Passivation layer 40 (sometimes referred to as passivation-1 or pass-1) is formed over interconnect structure 32. The respective process is illustrated as process 202 in the process flow 200 as shown in FIG. 20. In accordance with some embodiments, passivation layer 40 is formed of a non-low-k dielectric material with a dielectric constant greater than the dielectric constant of silicon oxide. Passivation layer 40 may be formed of or comprise an inorganic dielectric material, which may include a material selected from, and is not limited to, silicon nitride ($SiN_x$), silicon oxide ($SiO_2$), silicon oxy-nitride ($SiON_x$), silicon oxy-carbide ($SiOC_x$), silicon carbide (SiC), or the like, combinations thereof, and multi-layers thereof. The value "x" represents the relative atomic ratio. In accordance with some embodiments, the top surfaces of top dielectric layer 38A and metal lines 34A are coplanar. Accordingly, passivation layer 40 may be a planar layer.

Figure 2:
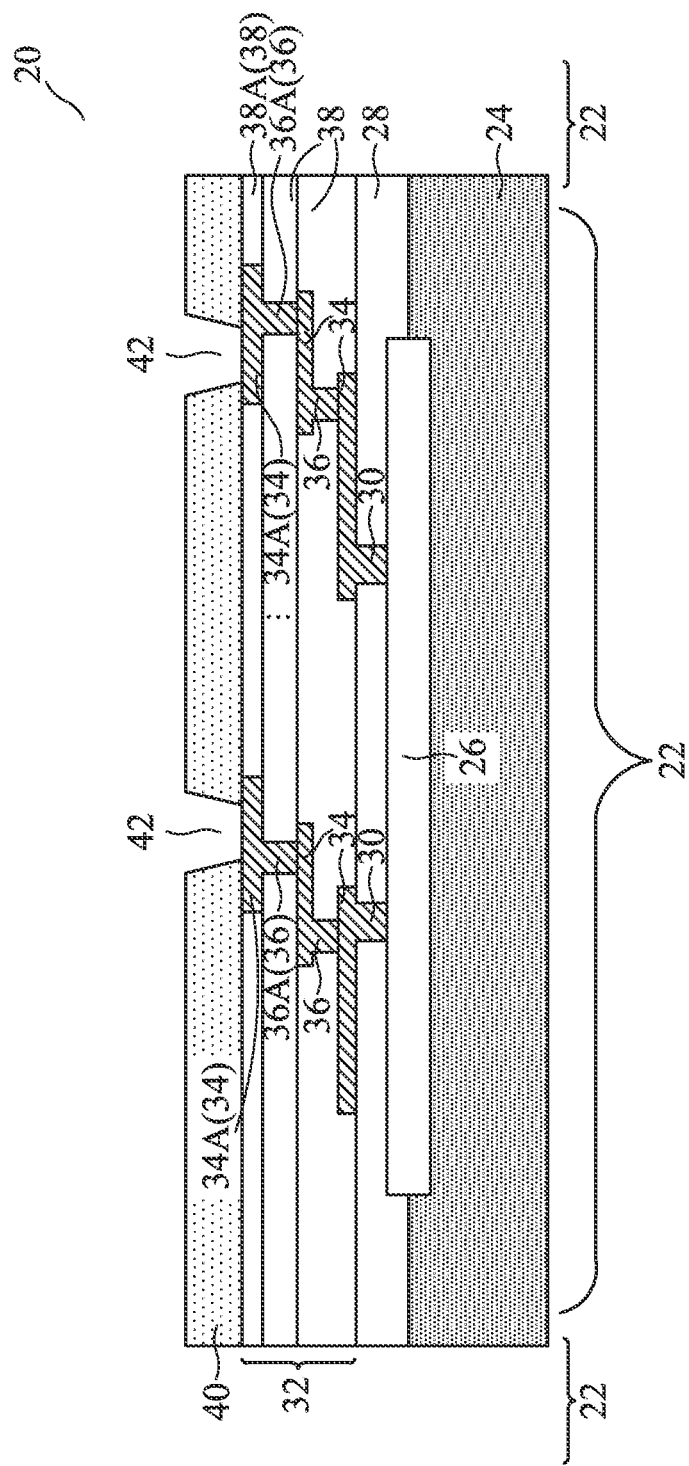

Referring to FIG. 2, passivation layer 40 is patterned in an etching process to form openings 42. The respective process is illustrated as process 204 in the process flow 200 as shown in FIG. 20. The etching process may include a dry etching process, which includes forming a patterned etching mask (not shown) such as a patterned photo resist, and then etching passivation layer 40. The patterned etching mask is then removed. Metal lines 34A are exposed through openings 42.

Figure 3:
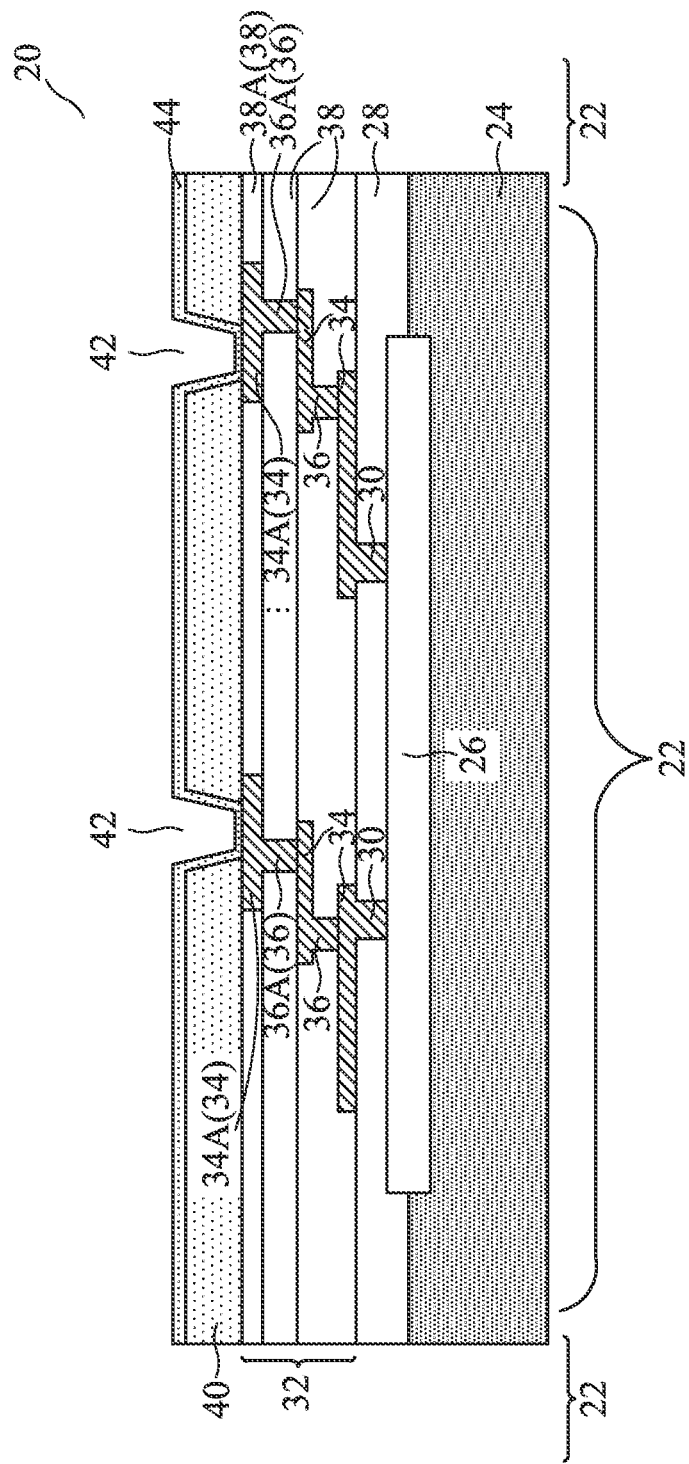

FIG. 3 illustrates the deposition of metal seed layer 44. The respective process is illustrated as process 206 in the process flow 200 as shown in FIG. 20. In accordance with some embodiments, metal seed layer 44 comprises a titanium layer and a copper layer over the titanium layer. In accordance with alternative embodiments, metal seed layer 44 comprises a copper layer in contact with passivation layer 40. The deposition process may be performed using Physical Vapor Deposition (PVD), Chemical Vapor Deposition (CVD), Metal Organic Chemical Vapor Deposition (MOCVD), or the like.

Figure 4:
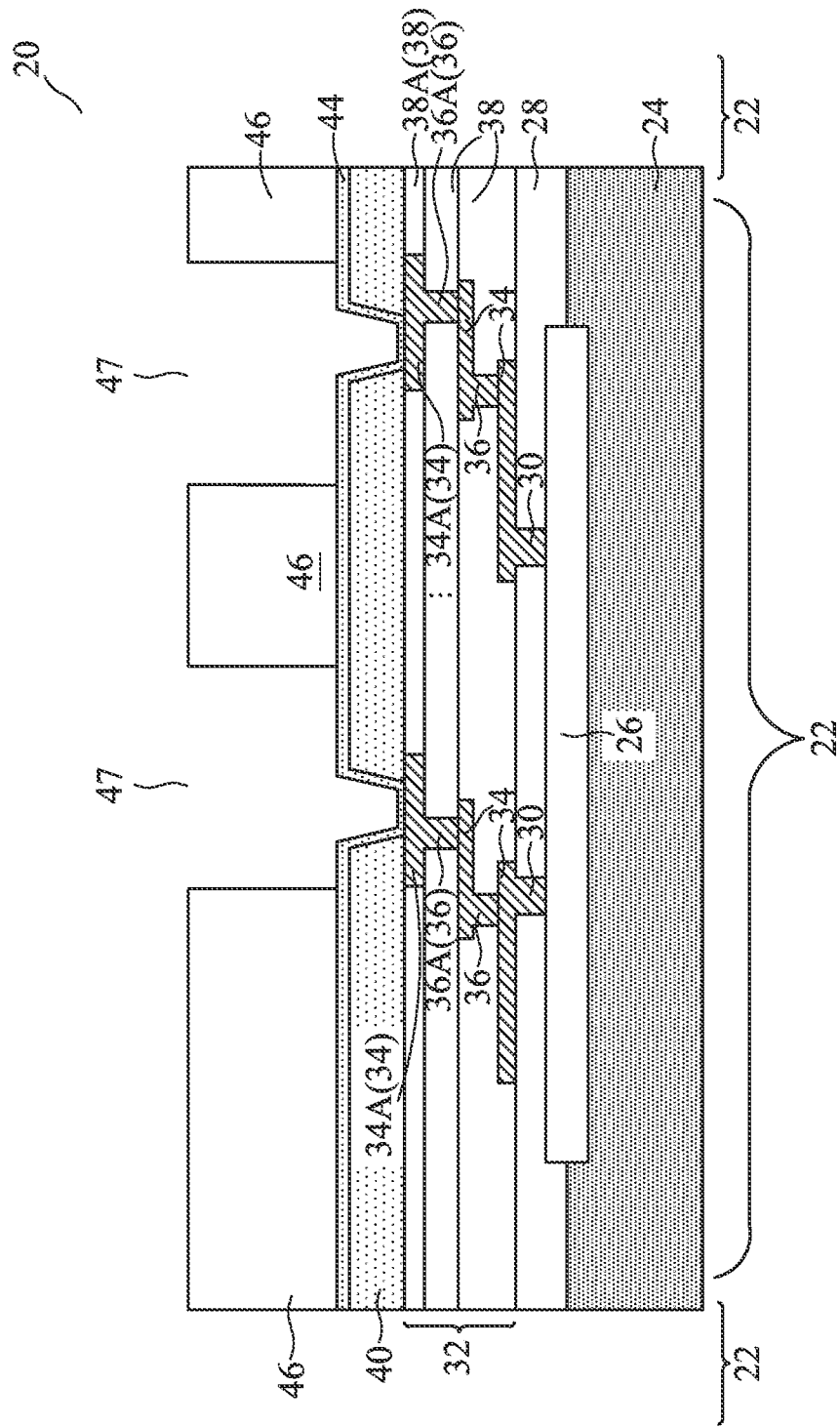

FIG. 4 illustrates the formation of patterned plating mask 46. The respective process is illustrated as process 208 in the process flow 200 as shown in FIG. 20. In accordance with some embodiments, plating mask 46 is formed of photo resist, and hence is alternatively referred to as photo resist 46. In accordance with alternative embodiments, other materials that are suitable for being used a plating mask, and can shrink under heating, may be used. The formation process includes coating a blanket photo resist (or another applicable material), and performing a pre-baking process on the photo resist. In accordance with some embodiments, the pre-baking may be performed at a temperature in the range between about 100 degrees and about 180 degrees. The pre-baking duration may be in the range between about 15 minutes and about 45 minutes.

After the pre-baking to reduce the amount of solvent and solidifying the photo resist 46, a light-exposure process is on the photo resist 46 using a lithography mask, which includes opaque patterns and transparent patterns. A development process is then performed to remove undesirable portions of photo resist 46, forming openings 47. In accordance with some embodiments, in the period of time starting from a first time the light-exposure process is finished and ending at a second time the development process is started, no baking process is performed. In accordance with alternative embodiments, a post-exposure baking process is performed during this period of time. The post-exposure baking process (if performed), will be performed for a controlled period of time and at a controlled temperature, so that photo resist 46 is not over baked. For example, the post-exposure baking process, if performed, may adopt a temperature in the range between about 30° C. and about 80° C., and for a period of time in the range between about 5 minutes and about 60 minutes.

In accordance with some embodiments, after the development process, no post-development baking process is performed. In accordance with alternative embodiments, a post-development baking process is performed. The post-development baking process, if performed, will be performed for a controlled period of time and at a controlled temperature, so that photo resist 46 is not over baked. For example, the post-development baking process, if performed, may adopt a temperature in the range between about 30° C. and about 80° C., and for a period of time in the range between about 5 minutes and about 60 minutes.

Figure 5:
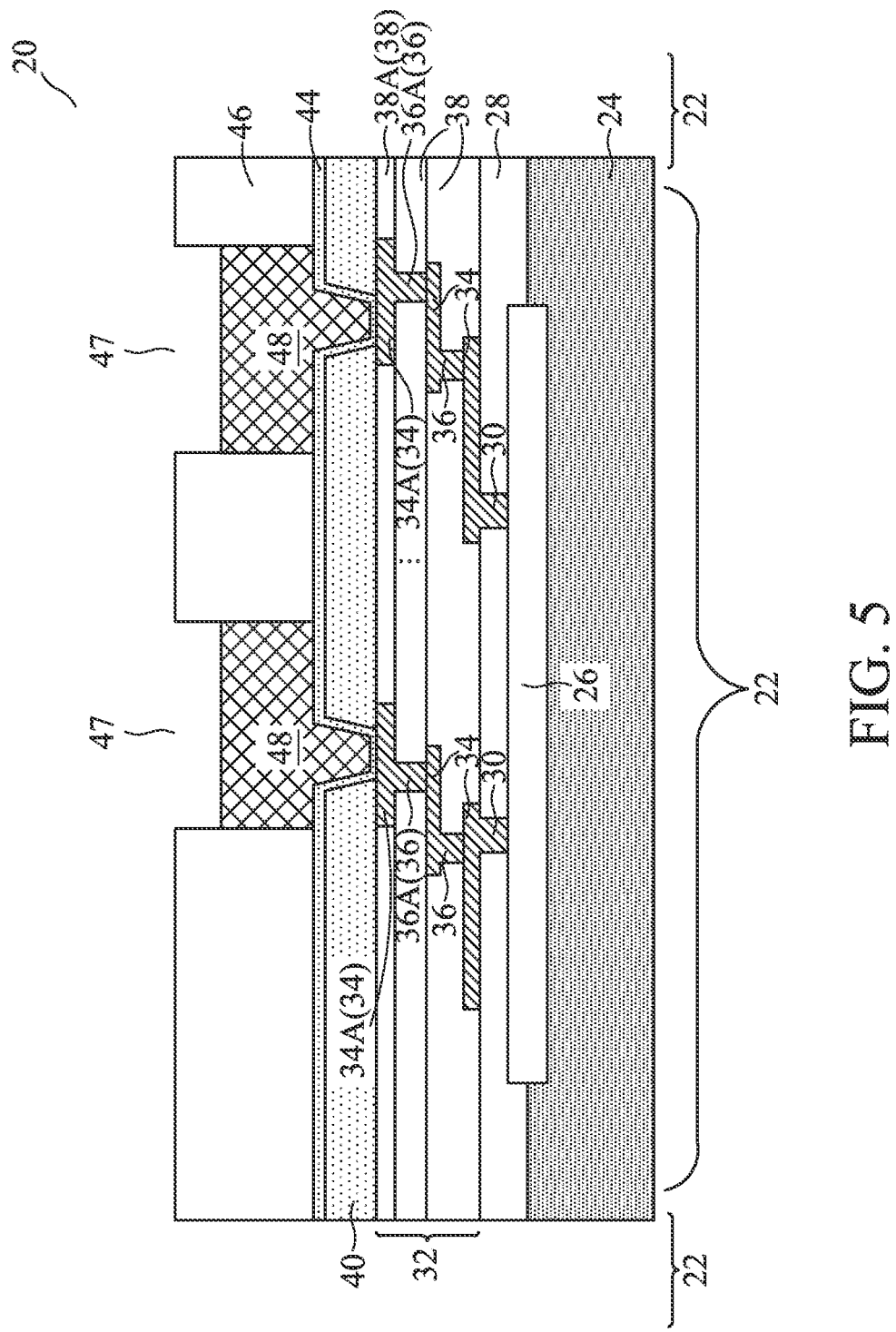

FIG. 5 illustrates the plating of conductive material (features) 48 into openings 47. The respective process is illustrated as process 210 in the process flow 200 as shown in FIG. 20. In accordance with some embodiments of the present disclosure, the formation of conductive feature 48 includes a plating process, which may include an electrochemical plating process, an electroless plating process, or the like. The plating is performed in a plating chemical solution. Conductive feature 48 may include copper, aluminum, nickel, tungsten, or the like, or alloys thereof. After the plating process, wafer 20 is removed from the plating chemical solution, and is then cleaned to remove the plating chemical. Wafer 20 is then transferred into deionized water held in a container.

Figure 6:
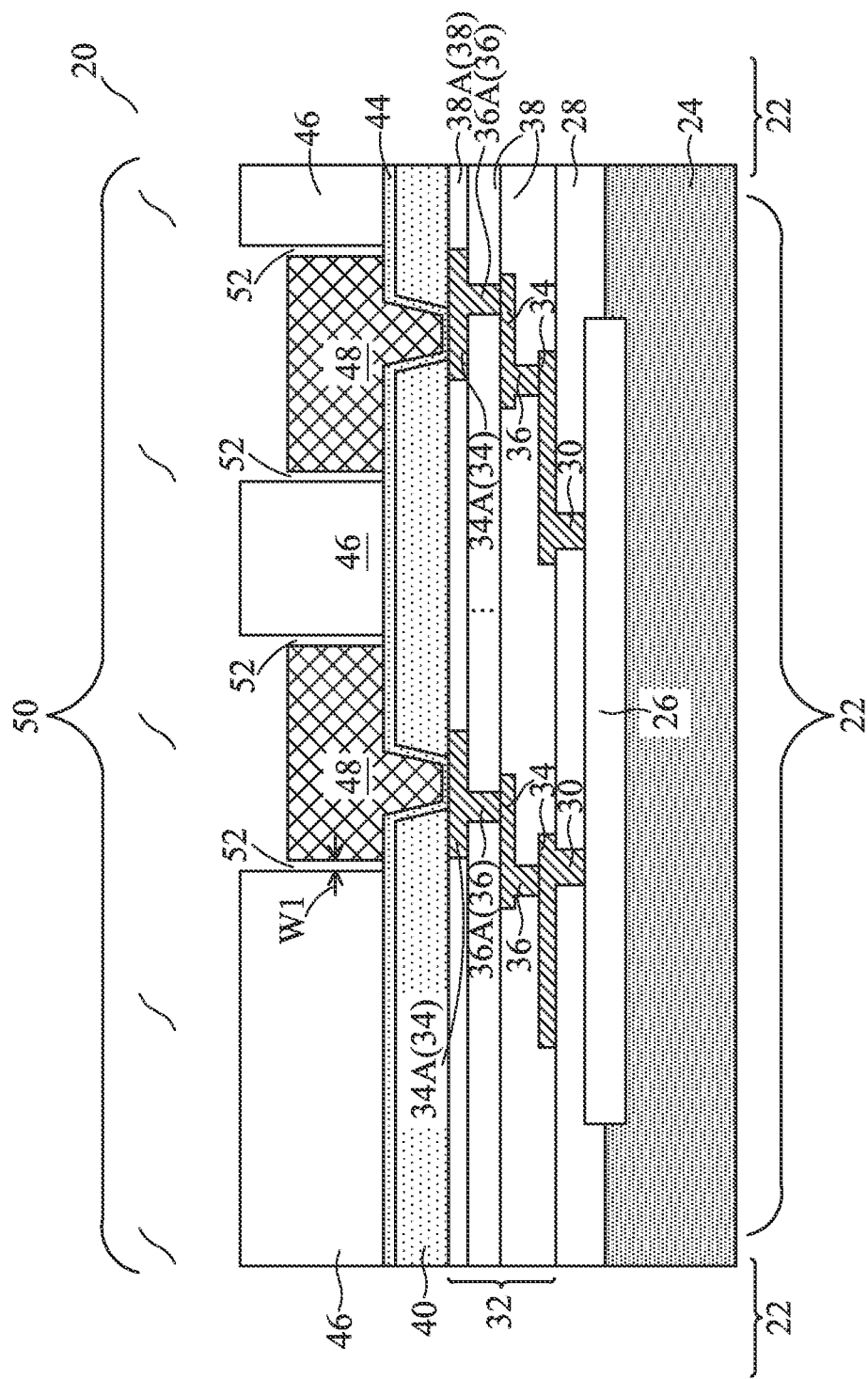

Referring to FIG. 6, a heating process 50 is performed to form gaps 52. The respective process is illustrated as process 212 in the process flow 200 as shown in FIG. 20. The heating process is performed at an elevated temperature higher than the room temperature (for example, about 19° C. to 23° C.). In accordance with some embodiments, the heating process is performed by pre-heating the deionized water to the desirable temperature, for example, in a range between about 40° C. and about 80° C., with the wafer 20 being placed into the already heated deionized water. In accordance with alternative embodiments, the deionized wafer is at the room temperature before wafer 20 is placed in, and is then heated with wafer 20 therein. In accordance with yet other embodiments, the heating process 50 is performed using an oven. In accordance with some embodiments, the heating temperature may be in the range between about 40° C. and about 80° C. The duration of the heating process 50 may be in the range between about 3 minutes and about 10 minutes.

It is appreciated that the intended heating temperature and the heating duration are related to the composition (material) of photo resist 46, and may need to be adjusted to achieve the desirable gaps 52. Furthermore, when photo resist 46 is less baked in preceding processes, a lower temperature and/or a shorter heating duration may be adopted. Conversely, when photo resist is 46 is more baked in preceding processes, a higher temperature and/or a longer heating duration may be adopted. Furthermore, to make the formation of gaps 52 easier, the baking process performed before the plating may be selected to be performed at lower temperatures and with shorter durations, so that the heating process may have a greater effect.

As a result of the heating process, photo resist 46 shrinks, and hence gaps 52 are formed. When viewed from the top of wafer 20, gaps 52 form a plurality of gap rings, each surrounding one of conductive feature 48. In accordance with some embodiments, gaps 52 have width W1 in the range between about 10 Å and about 5,000 Å.

Figure 7A:
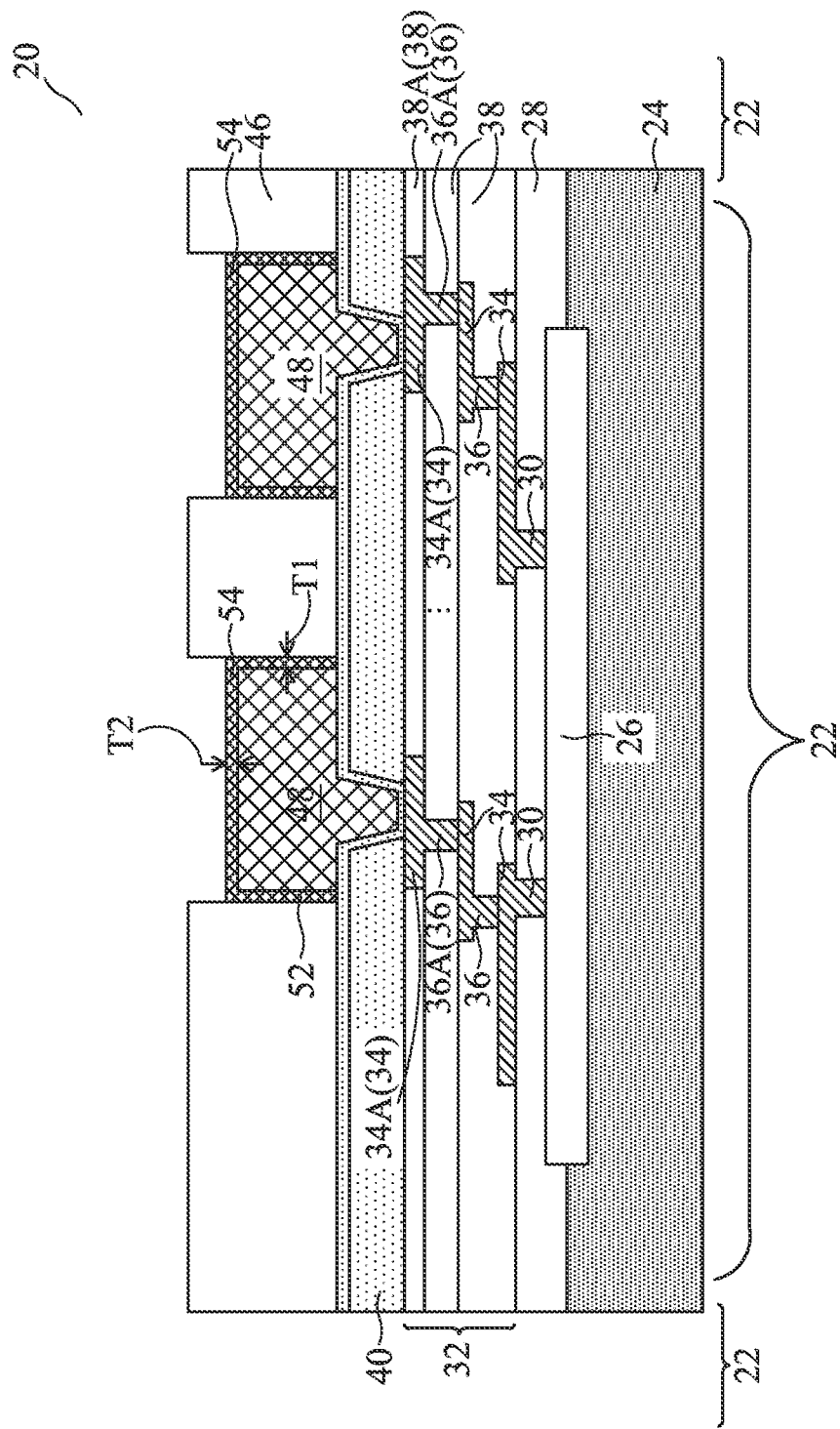
Figure 7B:
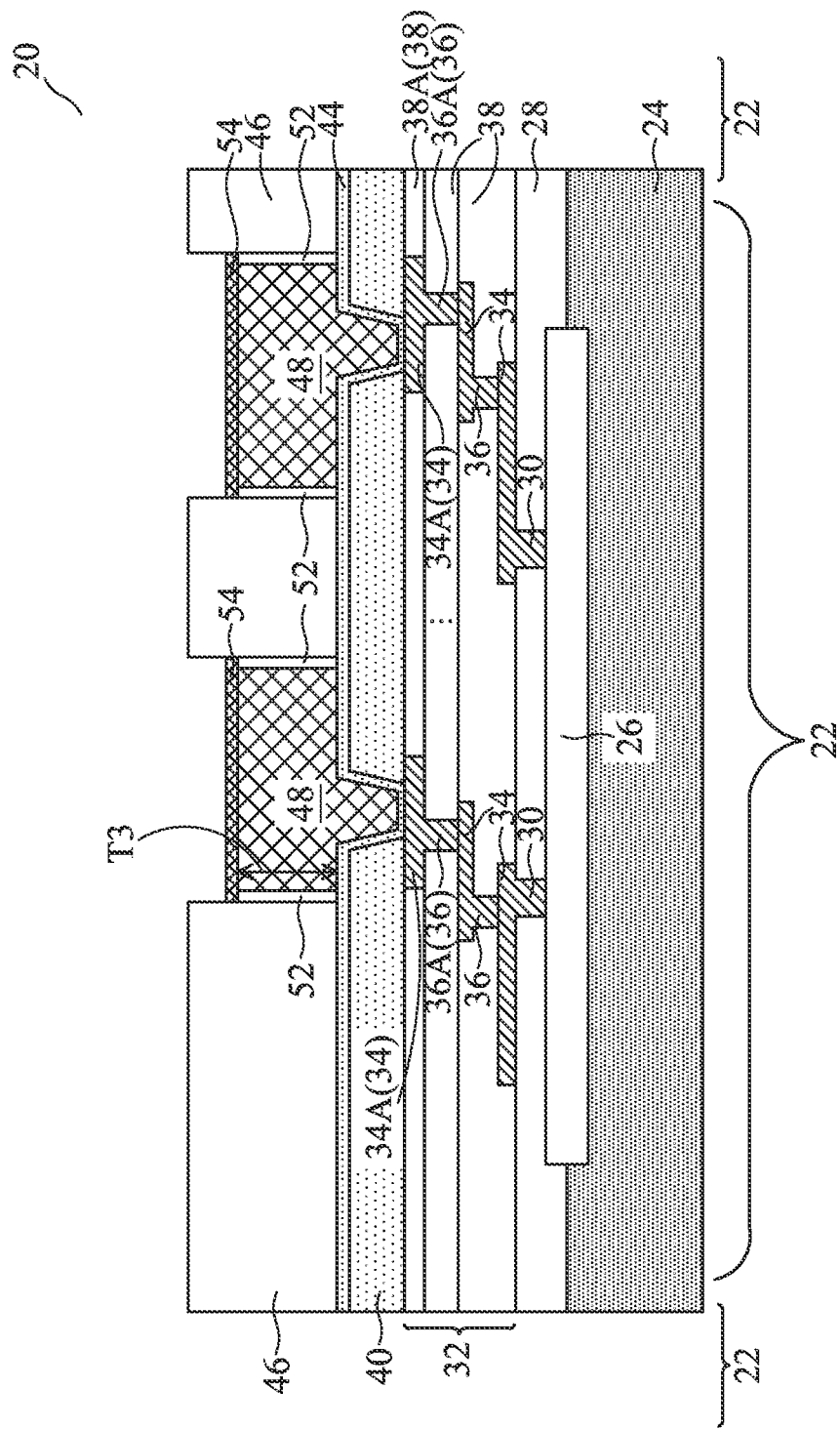
Figure 7C:
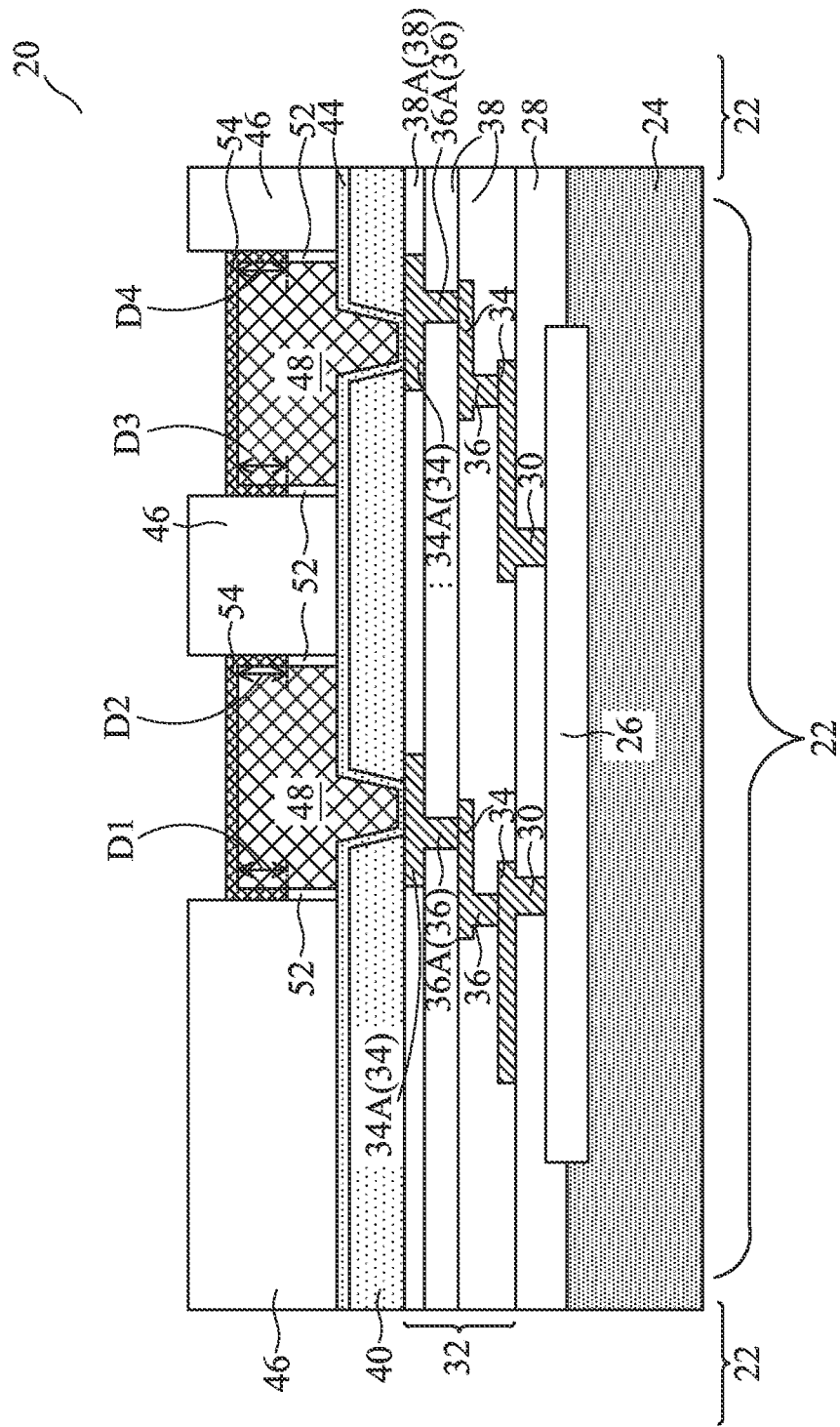

Referring to FIGS. 7A, 7B, and 7C, a plating process is performed to form protection layers 54 on conductive features 48. The respective process is illustrated as process 214 in the process flow 200 as shown in FIG. 20. The plating process may be performed using an electrochemical plating process or an electroless plating process. Protection layers 54 may be formed of or comprise Ni, Sn, Ag, Cr, Ti, Pt, or alloys thereof. For example, protection layers 54 may include a Sn—Ag alloy, with the Ag ranging between about 0.5 weight percent and about 2.5 weight percent. The plating duration may be in the range between about 1 minute and about 20 minutes, depending on the target thickness of the protection layers 54.

In the plating process, protection layers 54 are deposited on the top surfaces of conductive feature 48, and may, or may not, be deposited on the sidewalls of conductive feature 48. For example, when the widths W1 (FIG. 6) is large enough, protection layers 54 are able to go into gaps 52, and protection layers 54 are formed on the top surfaces and the sidewalls of conductive features 48 simultaneously. The resulting structure is shown in FIG. 7A. In accordance with these embodiments, the thickness T1 of the sidewalls portions of protection layers 54 may be equal to thickness T2 of the top portions of protection layers 54 in accordance with some embodiments. Alternatively, the thickness T2 of the top portions of protection layers 54 may be greater than thickness T1 of the sidewall portions. For example, when the gaps 52 are fully filled, the top portions of protection layers 54 may continue to be plated, and thickness T2 may be greater than (and may be significantly greater than) thickness T1. In accordance with some embodiments, ratio T2/T1 may be equal to 1.0, or may be greater than 1.0, for example, in the range between 1 and about 10.

In accordance with alternative embodiments, when the widths W1 (FIG. 6) is very small, protection layers 54 may not be able to go into gaps 52, and protection layers 54 are formed on the top surfaces of conductive features 48, and the resulting structure is shown in FIG. 7B. The sidewalls of conductive features 48 may thus be free from protection layers 54 formed thereon. The sidewalls of conductive features 48 may also be substantially free from protection layers 54 formed thereon, for example, when protection layers 54 extend down into gaps 52 for a depth smaller than about 5 percent of thickness T3 of the line portion of conductive features 48.

In accordance with yet alternative embodiments, as shown in FIG. 7C, protection layers 54 may extend partially into gaps 52, for example, with the top portions of gaps 52 being filled by protection layers 54, and the bottom portions of gaps 52 left unfilled and remaining as gaps. It is appreciated that in accordance with these embodiments, the depths D1, D2, D3, D4, etc., which are the depths of different portions of protection layers 54 extending into gaps 52, may be affected by random factors, and may be different from each other. Furthermore, even different parts of protection layers 54 on the same sidewall of the same conductive features 48 may have different and possibly random depths.

Figure 8:
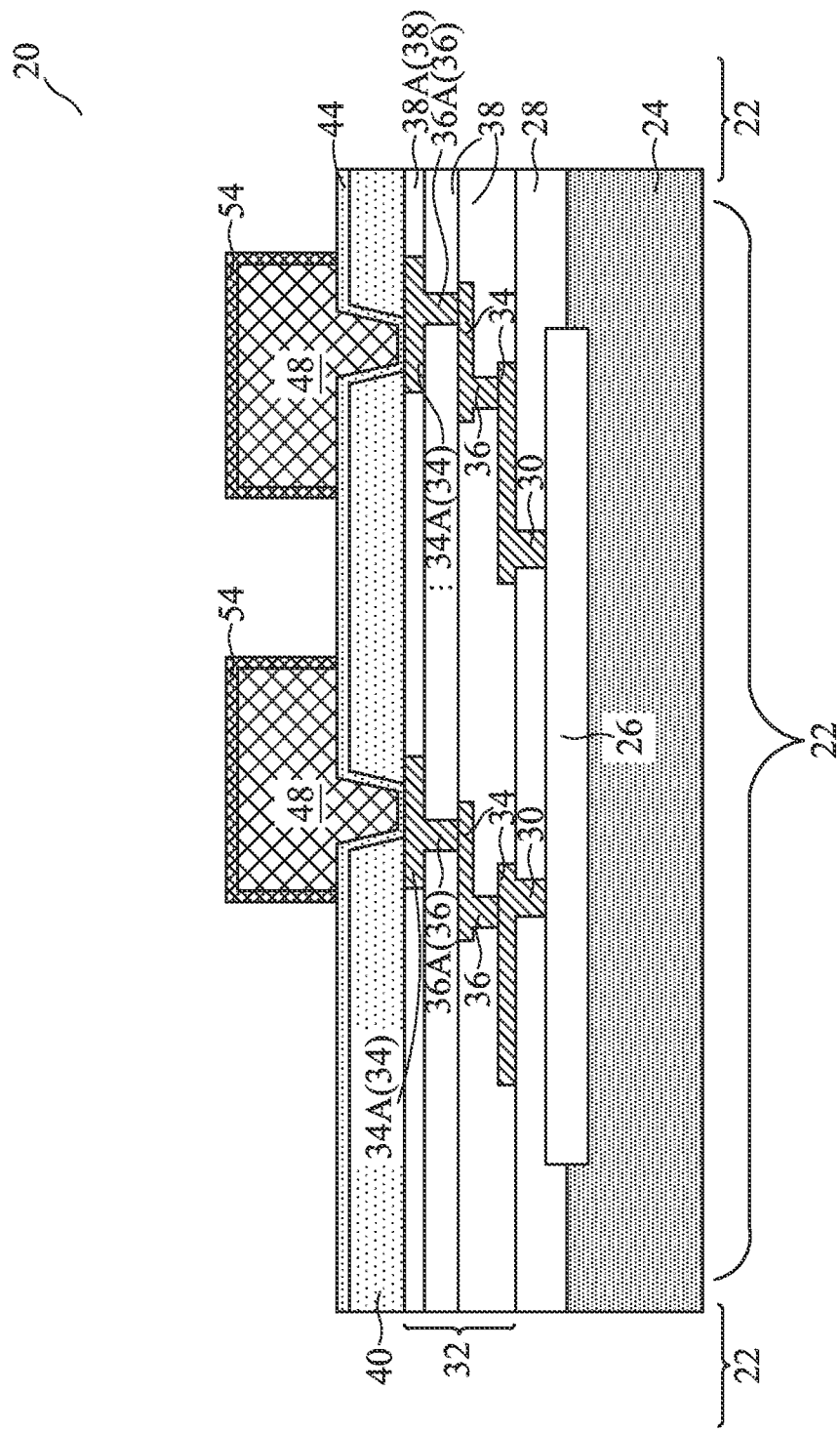

Next, photo resist (plating mask) 46 is removed, and one of the resulting structures is shown in FIG. 8. The respective process is illustrated as process 216 in the process flow 200 as shown in FIG. 20. In a subsequent process, an etching process is performed to remove the portions of metal seed layers 44 that are not protected by the overlying conductive features 48 and protection layers 54. The respective process is illustrated as process 218 in the process flow 200 as shown in FIG. 20. In accordance with some embodiments in which protection layers 54 extend down to metal seed layers 44 (FIG. 7A), the portions of metal seed layers 44 directly underlying and contacting protection layers 54 are protected from the etching process. The bottoms of protection layers 54 are accordingly in contact with or higher than the top surfaces of metal seed layers 44, and will not extend on the sidewalls of metal seed layers 44. In accordance with alternative embodiments (FIG. 7B or 7C) in which protection layers 54 do not extend to the top surface of metal seed layers 44, after the etching process, the sidewalls of metal seed layers 44 may be flushed with (or slightly recessed due to undercut) the corresponding sidewalls of conductive features 48. It is appreciated that undercut may be formed in metal seed layers 44, and metal seed layers 44 may be (or may not be) recessed laterally from the respectively outer sidewalls of protection layers 54. For example, dashed lines 44E shows the possible positions of the edges of metal seed layers 44. The edges of seed layers 44 may also be vertically aligned to any position between the dashed lines. Throughout the description, conductive features 48, the corresponding underlying metal seed layers 44, and the corresponding protection layers 54 are collectively referred to Redistribution Lines (RDLs) 56, which includes RDL 56A and RDL 56B. Each of RDLs 56 may include a via portion 56V extending into passivation layer 40, and a trace/line portion 56T over passivation layer 40.

Figure 10:
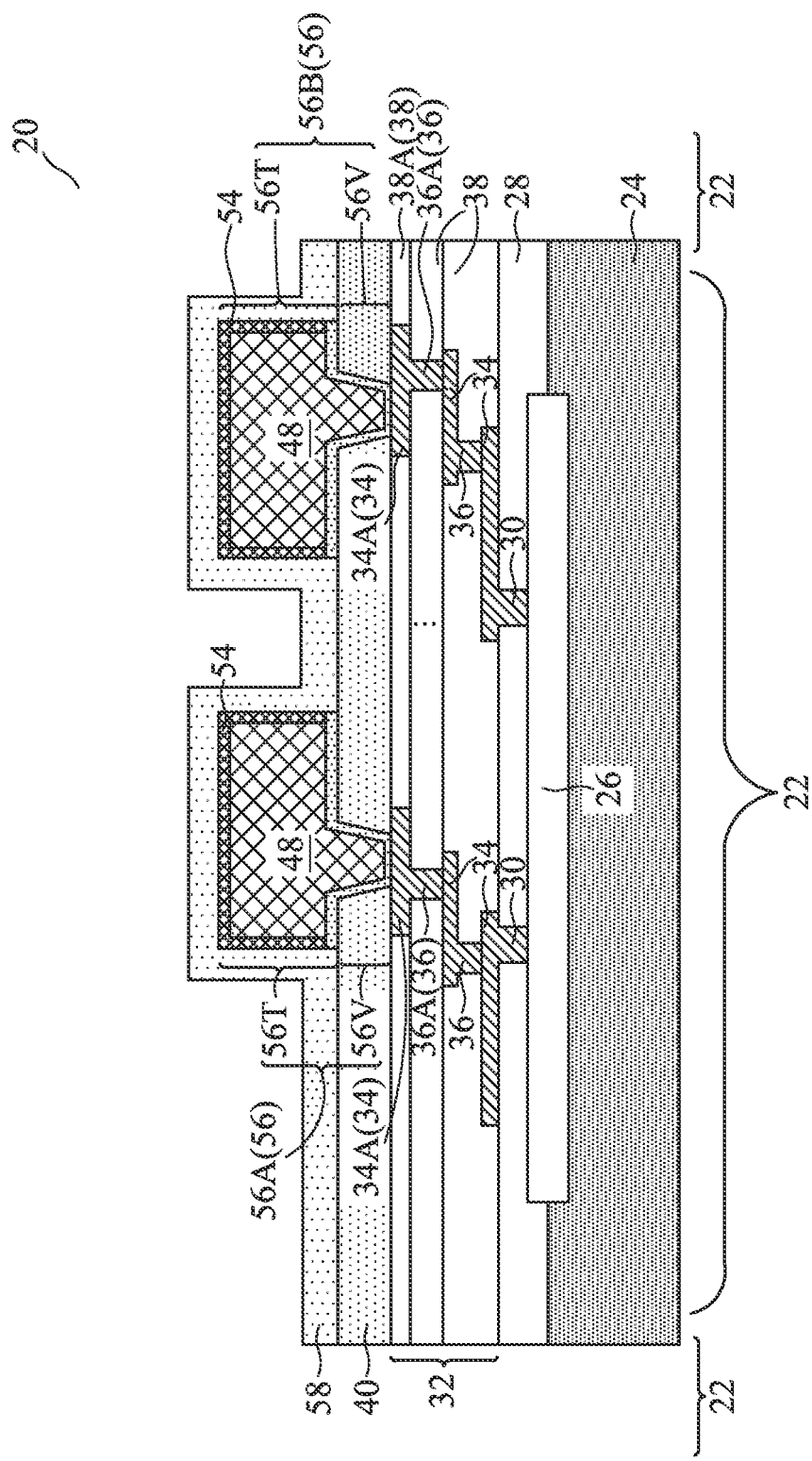

Referring to FIG. 10, passivation layer 58 is formed during a deposition process. The respective process is illustrated as process 220 in the process flow 200 as shown in FIG. 20. Passivation layer 58 (sometimes referred to as passivation-2 or pass-2) is formed as a blanket layer. In accordance with some embodiments, passivation layer 58 is formed of or comprises an inorganic dielectric material, which may include, and is not limited to, silicon nitride, silicon oxide, silicon oxy-nitride, silicon oxy-carbide, silicon carbide, or the like, combinations thereof, and multi-layers thereof. The material of passivation layer 58 may be the same or different from the material of passivation layer 40. The deposition may be performed through a conformal deposition process such as ALD, CVD, or the like. Accordingly, the vertical portions and horizontal portions of passivation layer 58 have the same thickness or substantially the same thickness, for example, with a variation smaller than about 10 percent. It is appreciated that regardless of whether passivation layer 58 is formed of a same material as passivation layer 40 or not, there may be a distinguishable interface, which may be visible, for example, in a Transmission Electron Microscopy (TEM) image of the structure.

Figure 11:
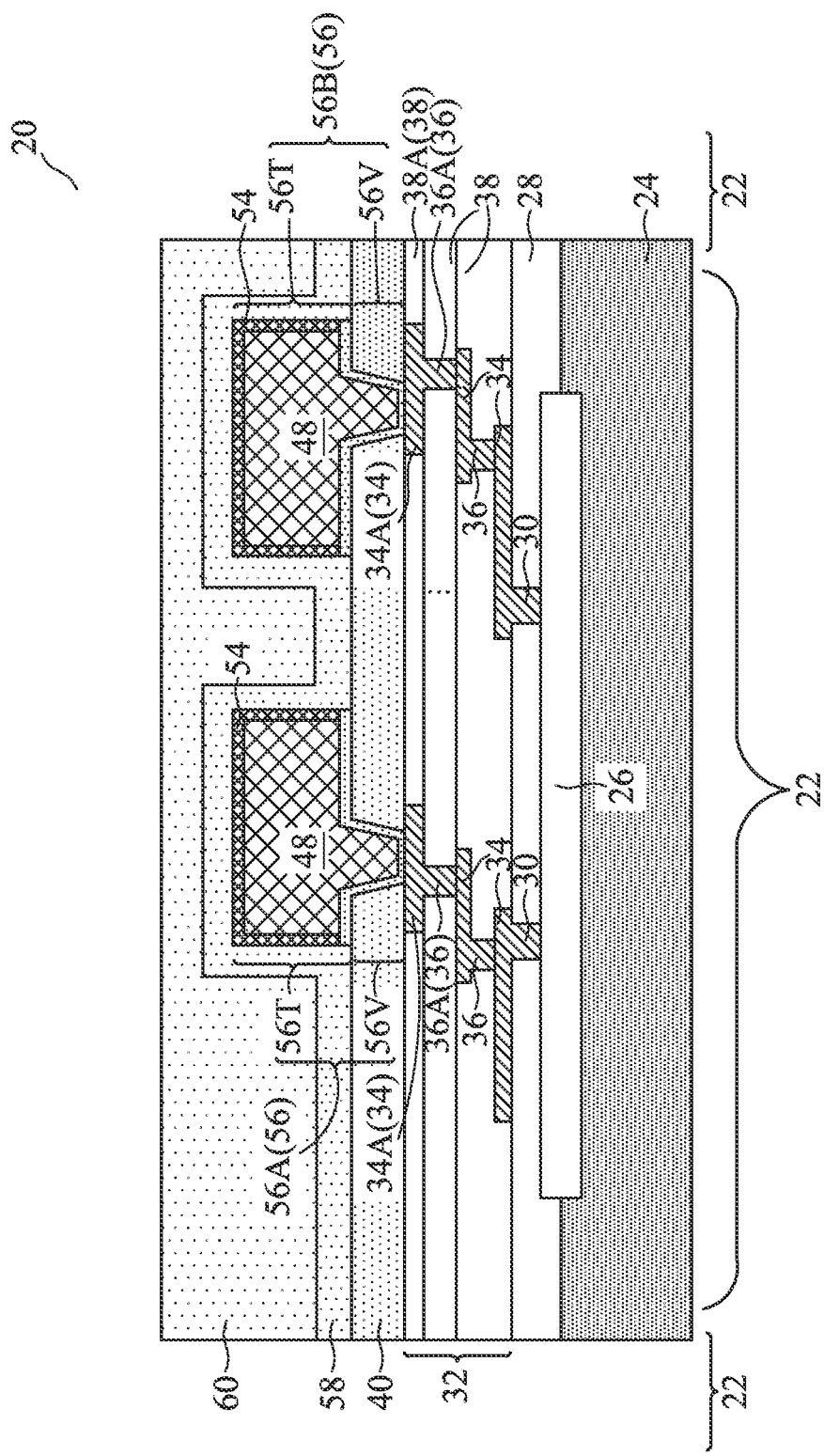

FIG. 11 illustrates the formation of planarization layer 60. The respective process is illustrated as process 222 in the process flow 200 as shown in FIG. 20. In accordance with some embodiments of the present disclosure, planarization layer 60 is formed of a polymer such as polyimide, polybenzoxazole (PBO), benzocyclobutene (BCB), an epoxy, or the like. In accordance with some embodiments, the formation of planarization layer 60 includes coating the planarization layer in a flowable form, and then baking to harden planarization layer 60. A planarization process such as a mechanical grinding process may be (or may not be) performed to level the top surface of planarization layer 60.

Figure 12:
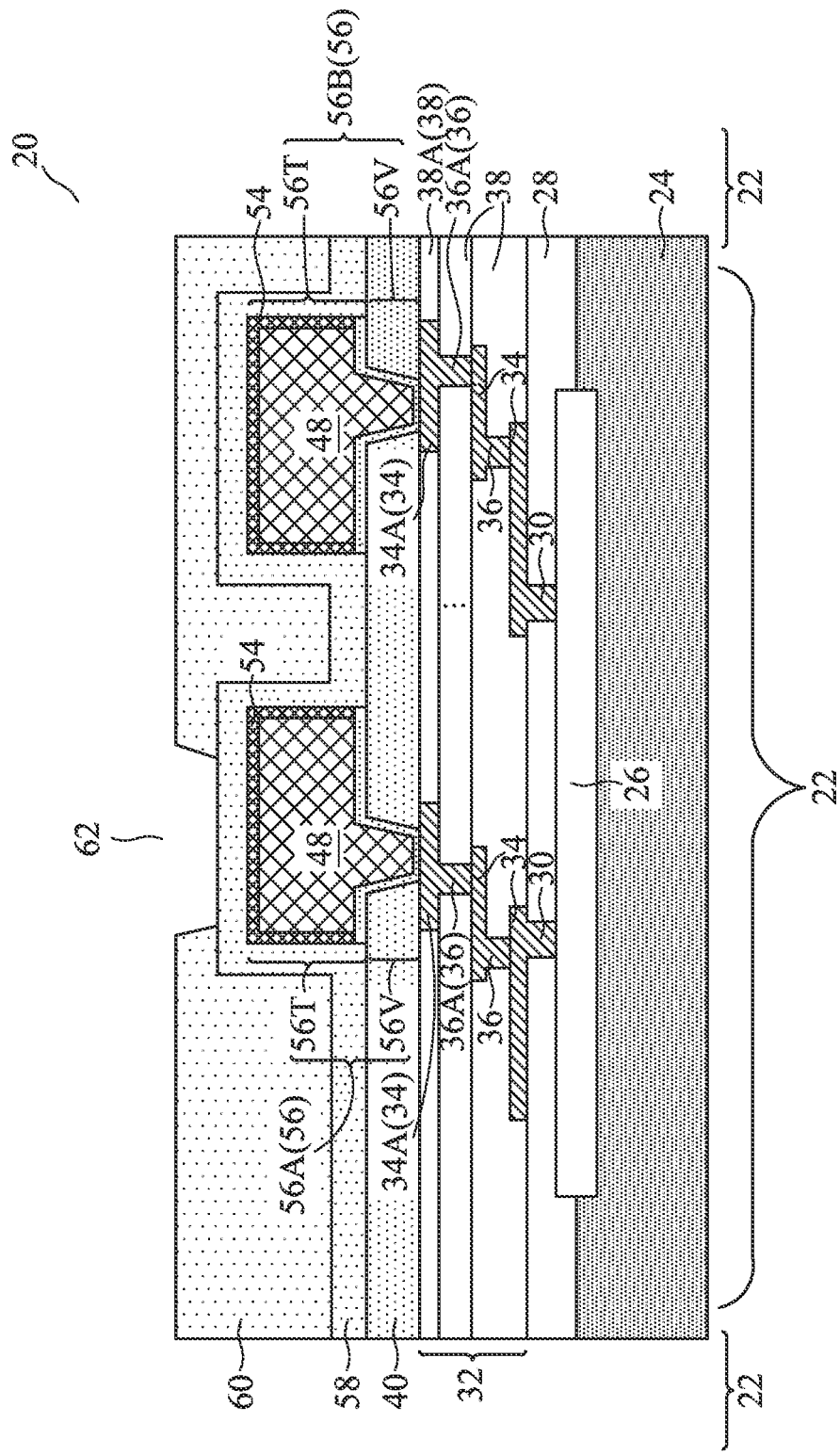

Referring to FIG. 12, planarization layer 60 is patterned, for example, through a light-exposure process followed by a development process. The respective process is illustrated as process 224 in the process flow 200 as shown in FIG. 20. Opening 62 is thus formed in planarization layer 60, and passivation layer 58 is exposed.

Figure 13:
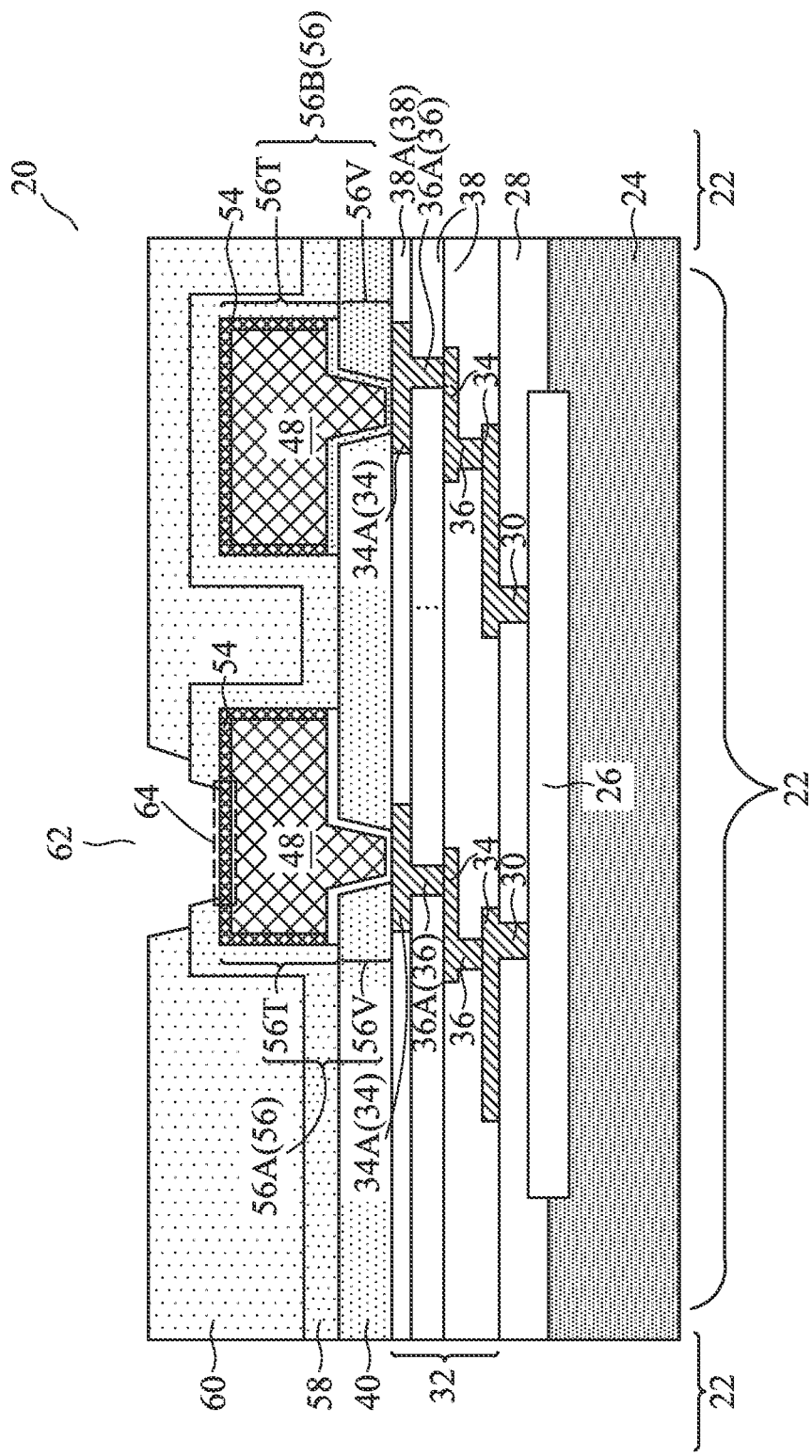

FIG. 13 illustrates the patterning of passivation layer 58 to extend opening 62 down. The respective process is illustrated as process 226 in the process flow 200 as shown in FIG. 20. In accordance with some embodiments, the patterning process includes forming an etching mask such as a photo resist (not shown), patterning the etching mask, and etching passivation layer 58 using the etching mask to define the pattern. In accordance with some embodiments, the etching of passivation layer 58 stops on the top surface of protection layers 54. In accordance with alternative embodiments, the etching is continued after passivation layer 58 is etched-through, so that protection layer 54 is etched-through. Accordingly, the portion of protection layer 54 in region 64 is removed, and the top surface of one of the conductive features 48 is exposed to opening 62. In accordance with some embodiments, no opening is formed to reveal RDL 56B.

Figure 14:
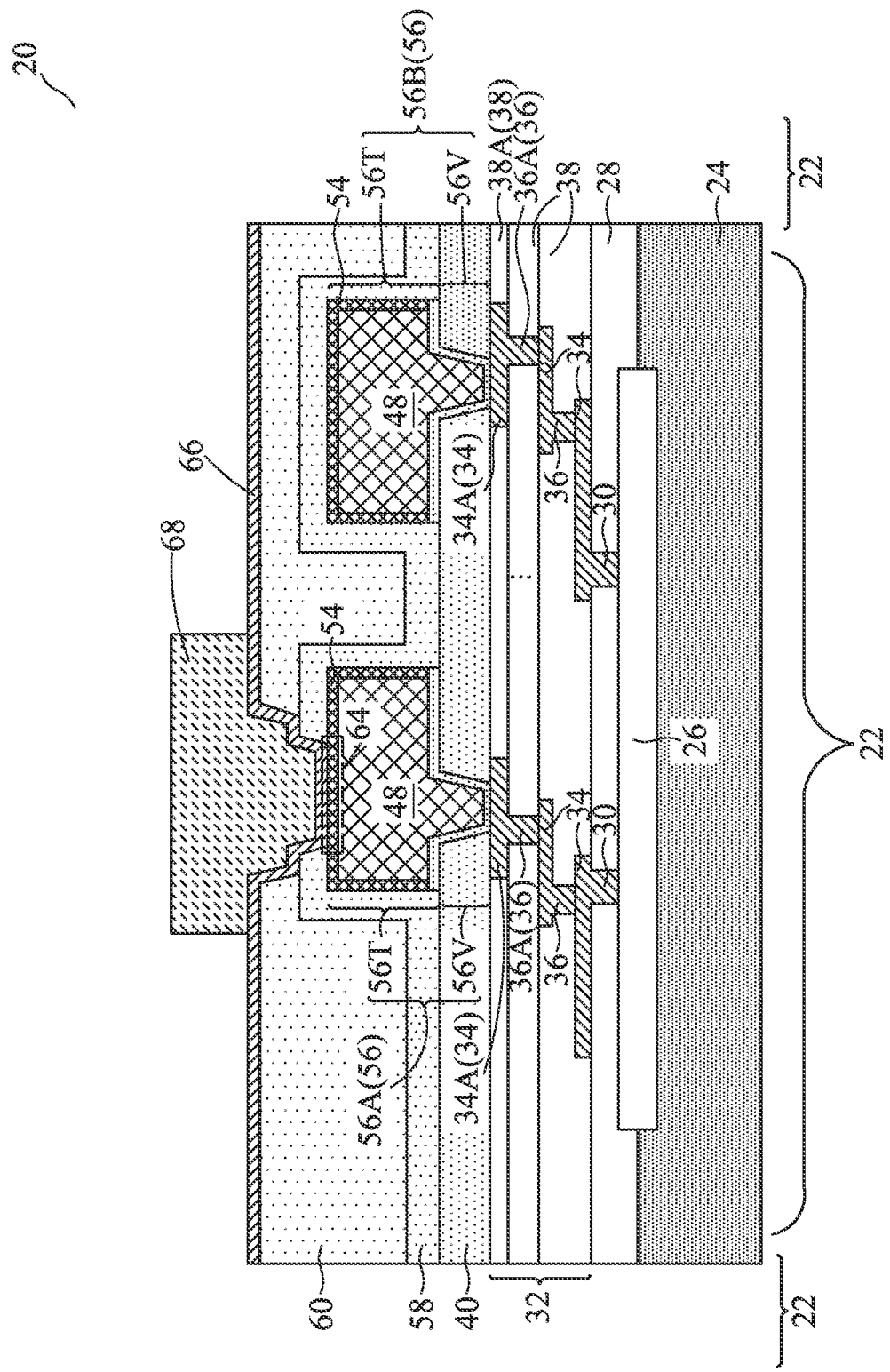

FIG. 14 illustrates the deposition of metal seed layer 66. The respective process is illustrated as process 228 in the process flow 200 as shown in FIG. 20. In accordance with some embodiments, metal seed layer 66 includes a titanium layer and a copper layer over the titanium layer. In accordance with alternative embodiments, metal seed layer 66 comprises a copper layer in contact with planarization layer 60, passivation layer 58, and the top surface of protection layer 54 or conductive feature 48.

Next, conductive material 68 is plated. The respective process is illustrated as process 230 in the process flow 200 as shown in FIG. 20. The process for plating conductive material 68 may include forming a patterned plating mask (a photo resist, for example, not shown), and plating conductive material 68 in an opening in the plating mask. The plating mask is then removed, leaving the structure as shown in FIG. 14.

Figure 15:
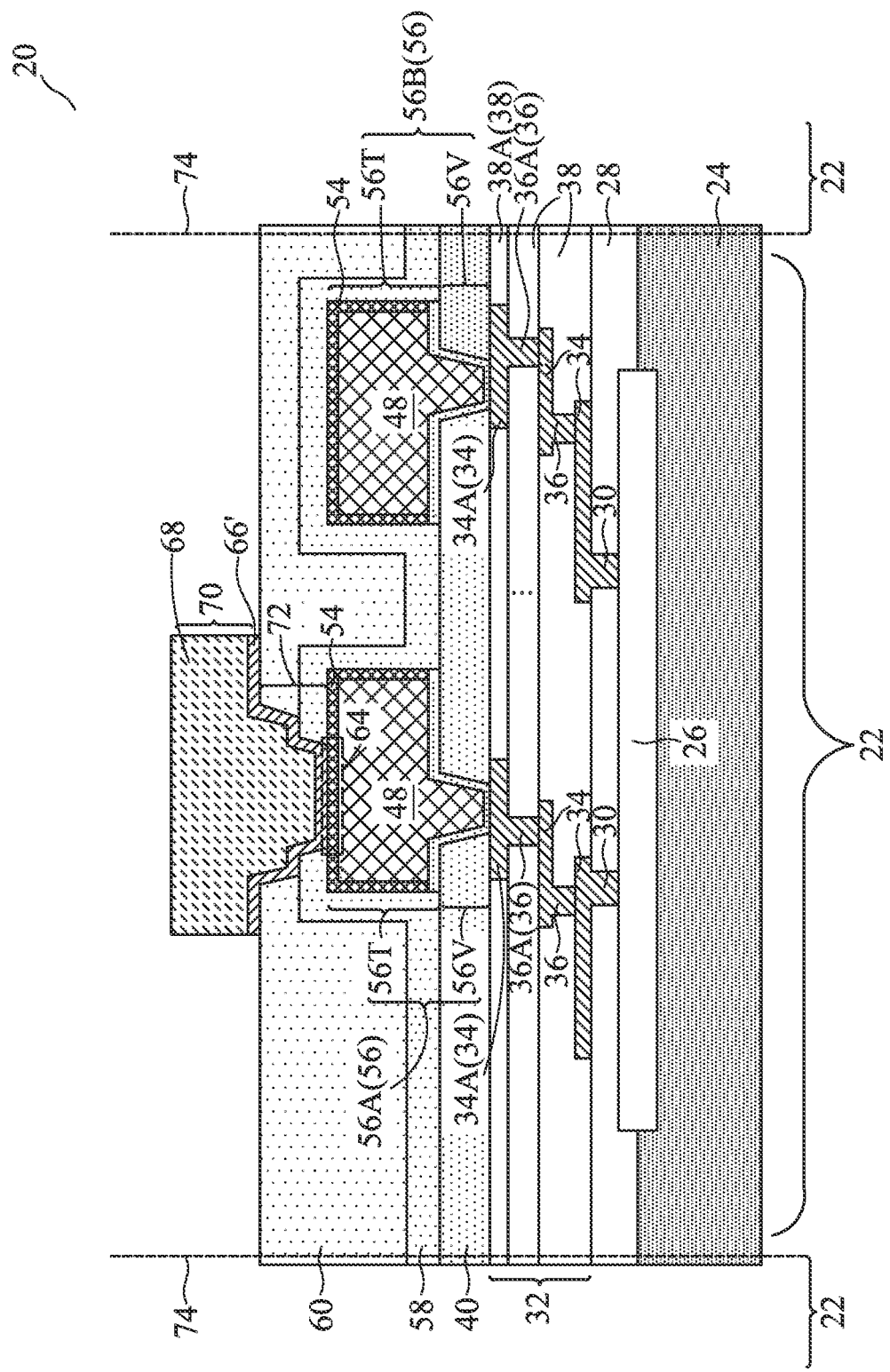

Metal seed layer 66 is then etched, and the portions of metal seed layer 66 that are exposed after the removal of the plating mask are removed, while the portions of metal seed layer 66 directly underlying conductive material 68 are left after the etching process. The respective process is illustrated as process 232 in the process flow 200 as shown in FIG. 20. The resulting structure is shown in FIG. 15. A remaining portion of metal seed layer 66 is an Under-Bump Metallurgy (UBM) 66'. In accordance with some embodiments in which protection layer 54 was not etched-through in the process shown in FIG. 13, UBM 66' contacts the top surface of protection layer 54. In accordance with alternative embodiments in which protection layer 54 was etched-through in the process shown in FIG. 13, UBM 66' contacts the top surface of conductive feature 48 and the edges of protection layer 54. UBM 66' and conductive material 68 in combination form via 72 and electrical connector 70 (which is also referred to as a bump).

In accordance with alternative embodiments, each of the electrical connector 70 and the conductive features 48 might be or include RDL having protection layers 54. In other words, the wafer 20 might include more than one RDL layer, and the protection layer 54 might be formed on one or more of the conductive features of the RDL layers.

In a subsequent process, wafer 20 is singulated, for example, sawed along scribe lines 74 to form individual device dies 22. The respective process is illustrated as process 234 in the process flow 200 as shown in FIG. 20. Device dies 22 are also referred to as devices 22 or package components 22 since devices 22 may be used for bonding to other package components in order to form packages. As aforementioned, devices 22 may be device dies, interposers, package substrate, packages, or the like.

Figure 16:
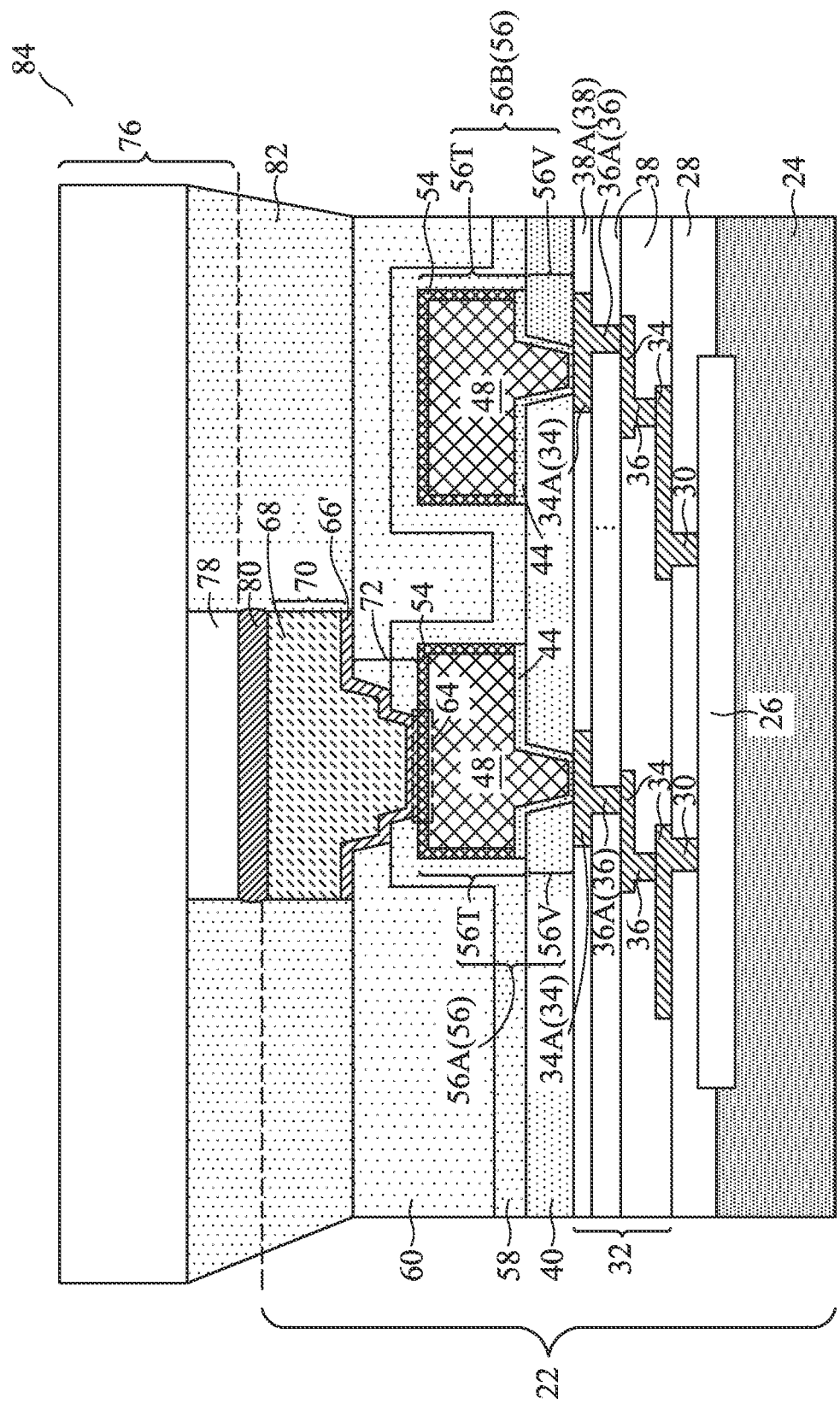

Referring to FIG. 16, device 22 is bonded with package component 76 to form package 84. The respective process is illustrated as process 236 in the process flow 200 as shown in FIG. 20. In accordance with some embodiments, package component 76 is or comprises an interposer, a package substrate, a printed circuit board, a package, or the like. Electrical connector 70 may be bonded to the bon d pad 78 in package component 76 through conductive feature and solder region 80. Underfill 82 is dispensed between device 22 and package component 76.

Figure 9:
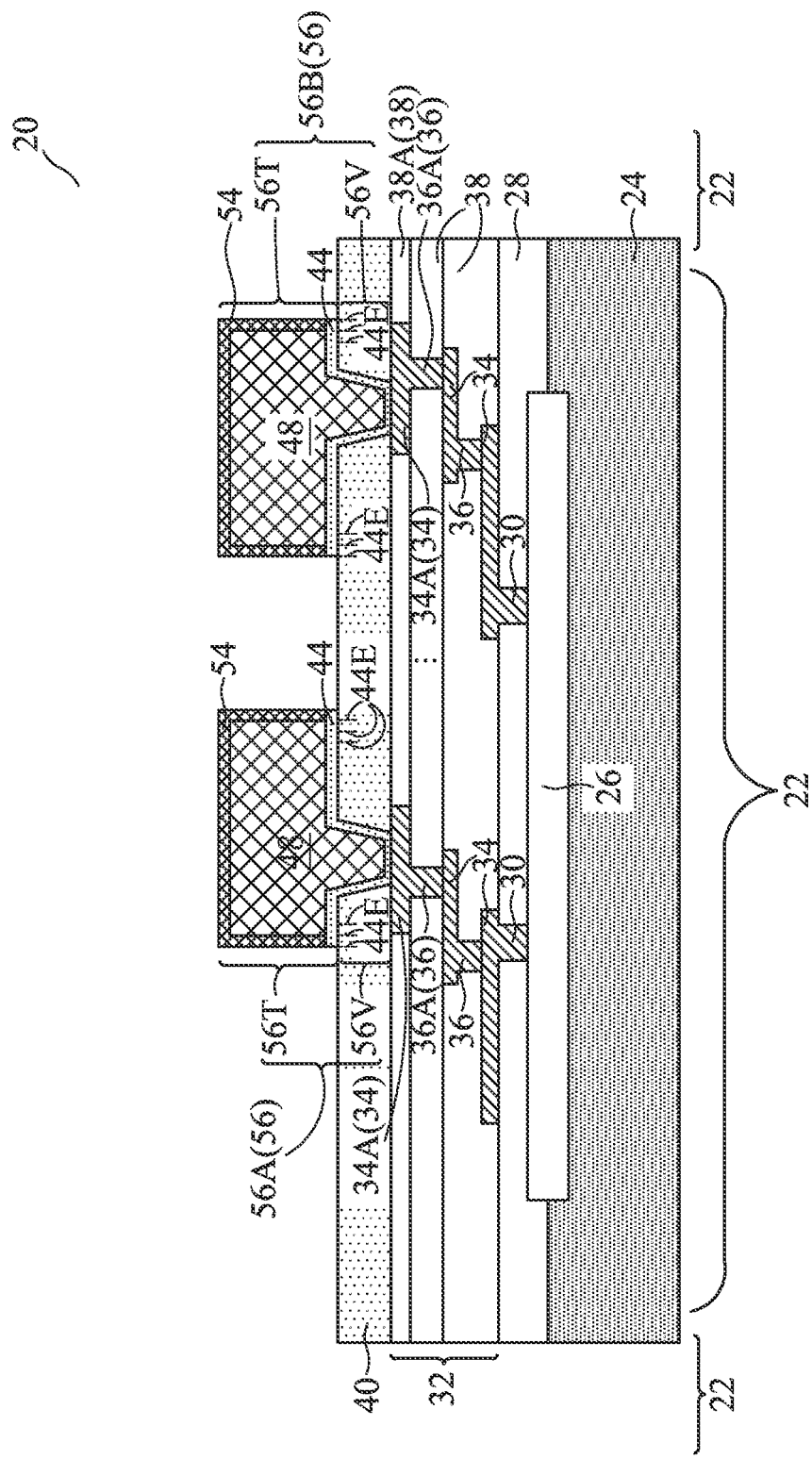

In accordance with some embodiments, protection layers 54 have two functions. Firstly, as shown in FIGS. 8 and 9 and FIG. 13, in various stages, protection layers 54 may protect the underlying conductive features 48 from oxidation or reduces oxidation, for example, due to the exposure of conductive features 48 to open environment. Secondly, protection layers 54 may act as an adhesion layer to improve the adhesion between conductive features 48 and passivation layer 58.

Figure 19:
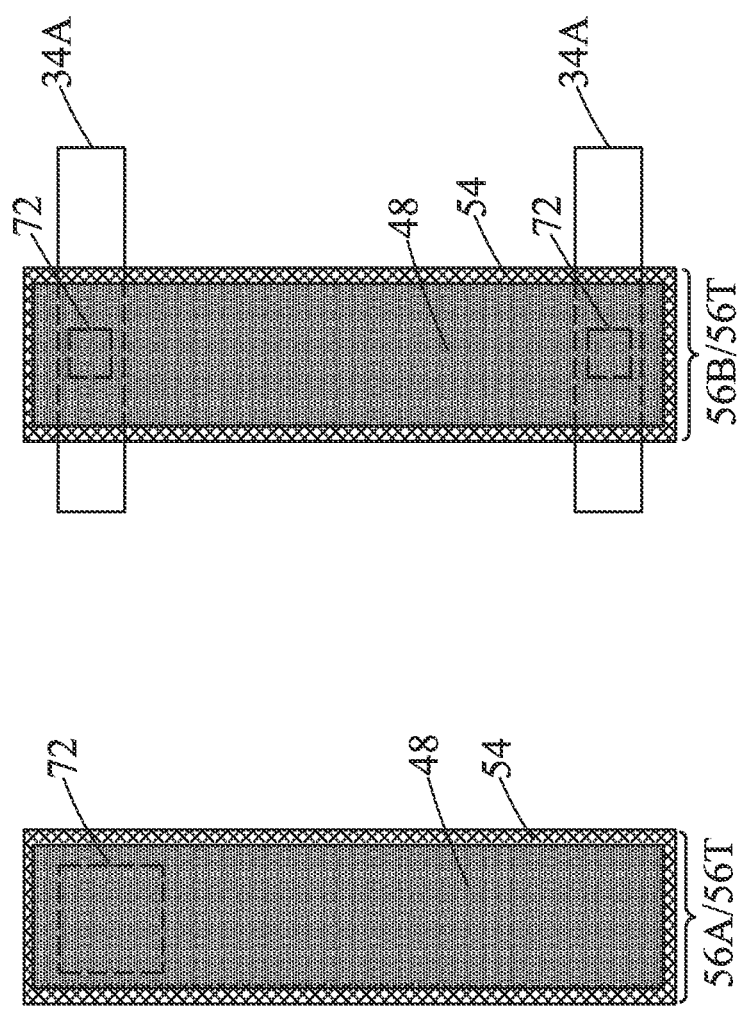
FIG. 19 illustrates a top view of a redistribution line and a protection layer in accordance with some embodiments.

FIG. 16 illustrates two RDLs 56, which are also denoted as 56A and 56B. In accordance with some embodiments, RDL 56A is used for electrically connecting electrical connector 70 to the underlying integrated circuit devices 26. On the other hand, RDL 56B is not connected to any overlying electrical connector, and is used for internal electrical redistribution for electrically connecting the features inside device 22. For example, the opposing ends of RDL 56B may be connected to two of metal lines 34A (FIGS. 16 and 19). Alternatively stated, an entirety of RDL 56B is covered by passivation layer 58, and all sidewalls of RDL 56B may be in contact with passivation layer 58.

FIG. 19 illustrates the top view of example RDLs 56A and 56B in accordance with some embodiments. Each of RDLs 56A and 56B includes conductive feature 48 and a protection layer 54 laterally extending beyond all edges of the corresponding RDLs 56A and 56B. Via 72 (Also refer to FIG. 16) is over and lands on a top surface of RDL 56A. The opposing ends of RDL 56B may be connected to two underlying metal lines 34A through vias 36A. Accordingly, RDL 56B is used as an internal redistribution line.

Figure 17:
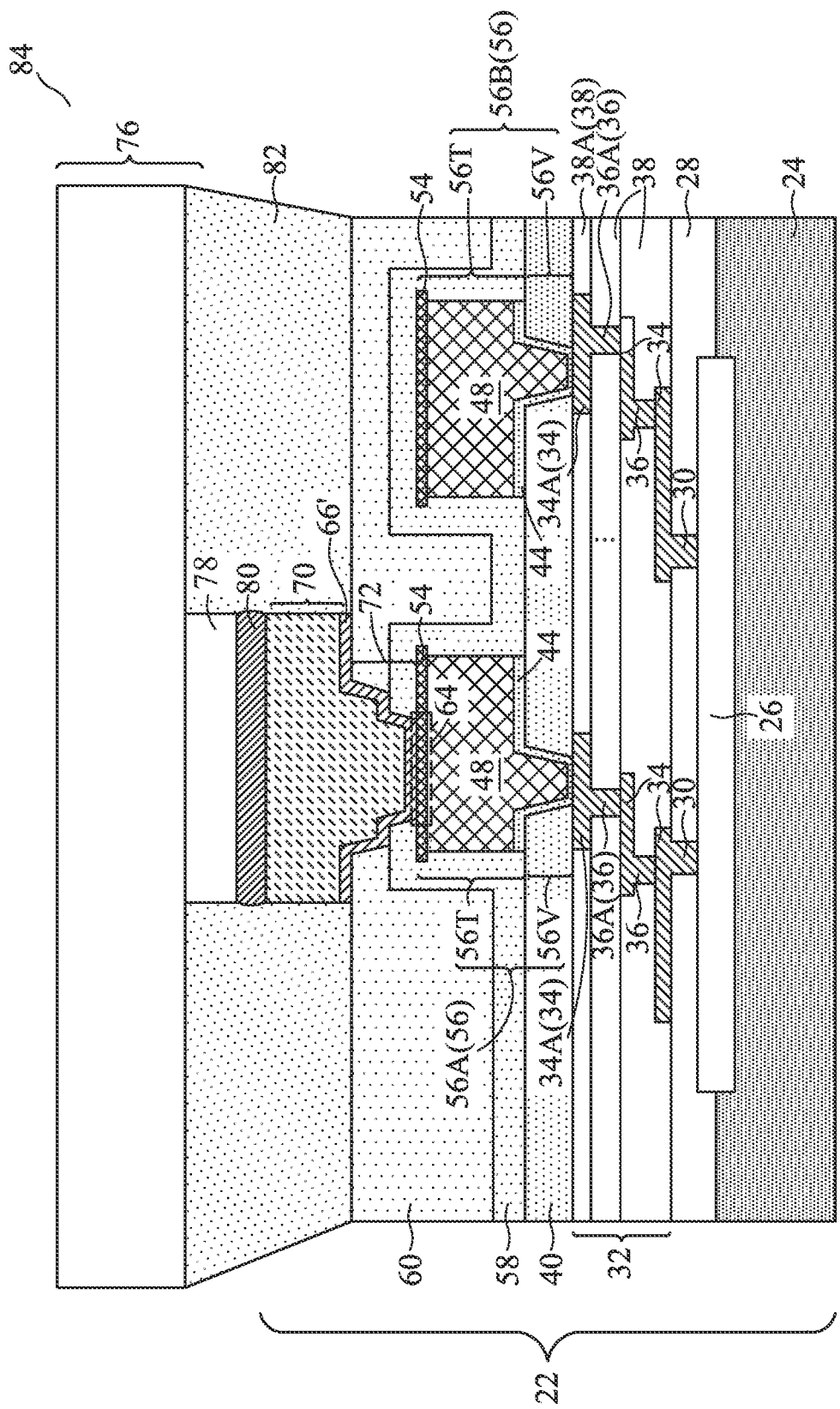
FIGS. 17 and 18 illustrate the cross-sectional views of devices in accordance with some embodiments.

FIG. 17 illustrates a package 84 formed in accordance with alternative embodiments. Package 84 in accordance with these embodiments may correspond to the structure shown in FIG. 7B, in which protection layers 54 is formed on the top surface of, and does not, or substantially does not extend on the sidewalls of conductive feature 48. In accordance with these embodiments, passivation layer 58 is in physical contact with the sidewalls of conductive feature 48. Furthermore, some portions of the passivation layer 58 may be directly under, and may be overlapped by, some edge portions of protection layers 54.

Figure 18:
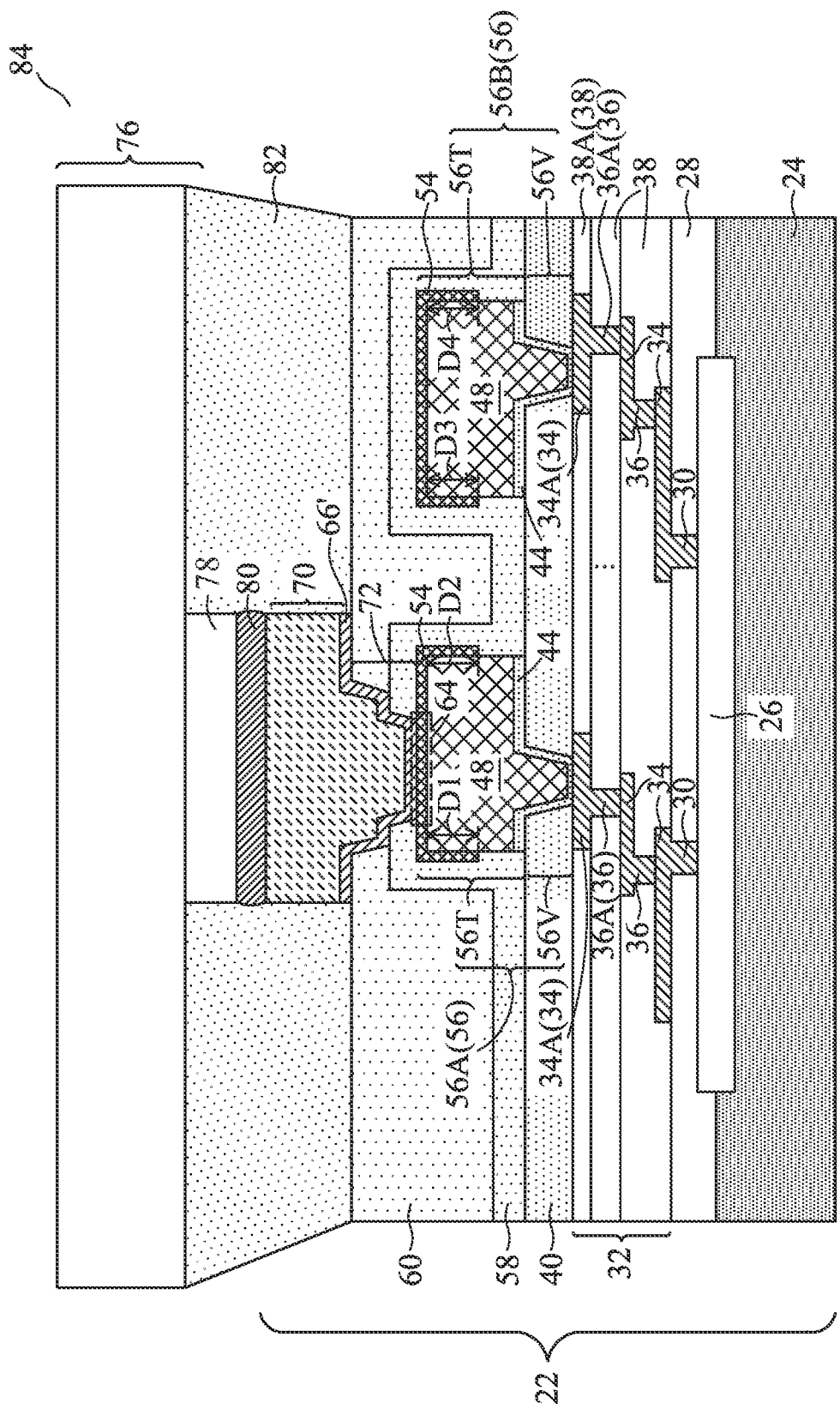

FIG. 18 illustrates a package 84 formed in accordance with yet alternative embodiments. Package 84 in accordance with these embodiments may correspond to the structure shown in FIG. 7C, in which protection layers 54 extend onto the top portions of the sidewalls of conductive feature 48, and don't extend onto the bottom portions of the sidewalls of conductive feature 48. In accordance with these embodiments, protection layers 54 are in physical contact with the top portions of the sidewalls of conductive feature 48, while passivation layers 58 are in physical contact with the bottom portions of the sidewalls of conductive feature 48. In accordance with some embodiments, different parts of the sidewall portions of protection layers 54 may extend to different depths downwardly from the top surface of conductive feature 48.

In the illustrated embodiments, protection layers are formed on the RDLs immediately underlying UBMs. It is appreciated that the embodiments of the present disclosure may be used for forming protection layers on other conductive connections in other layers, providing other conductive connections are formed through plating. For example, another RDL layer may be formed between RDLs 56 and top metal lines 34A, and protection layers may be formed on the metal lines of this RDL layer.

The embodiments of the present disclosure have some advantageous features. By forming protection layers as parts of the redistribution lines, the oxidation of the conductive material in the redistribution lines is reduced. Furthermore, the adhesion of the redistribution lines to the covering dielectric layer(s) is improved.

In accordance with some embodiments of the present disclosure, a method includes forming a metal seed layer over a first conductive feature of a wafer; forming a patterned photo resist on the metal seed layer; forming a second conductive feature in an opening in the patterned photo resist; heating the wafer to generate a gap between the second conductive feature and the patterned photo resist; plating a protection layer on the second conductive feature; removing the patterned photo resist; and etching the metal seed layer. In an embodiment, the heating is performed at a temperature in a range between about 40° C. and about 80° C. In an embodiment, the heating is performed for a period of time in a range between about 3 minutes and about 10 minutes. In an embodiment, the plating the protection layer comprises plating a metal layer comprising a metal selected from the group consisting of Ni, Sn, Ag, Cr, Ti, Pt, and combinations thereof. In an embodiment, the method further comprises depositing a passivation layer on the protection layer; forming a planarization layer on the passivation layer; etching-through the planarization layer and the passivation layer; and forming a third conductive feature extending into the planarization layer and the passivation layer to electrically connect to the second conductive feature. In an embodiment, the third conductive feature contacts a top surface of the protection layer. In an embodiment, the method further comprises etching-through the protection layer, and the third conductive feature contacts a top surface of the second conductive feature.

In accordance with some embodiments of the present disclosure, a device includes a first dielectric layer; a redistribution line comprising a portion over the first dielectric layer, wherein the redistribution line comprises a first conductive feature; and a protection layer comprising a top portion over and contacting a first top surface of the first conductive feature; and a second dielectric layer extending on a sidewall and a second top surface of the redistribution line. In an embodiment, the device further comprises an under-bump metallurgy over and electrically connecting to the protection layer. In an embodiment, the under-bump metallurgy comprises a bottom surface contacting a top surface of the protection layer. In an embodiment, the under-bump metallurgy penetrates through the protection layer to contact the first top surface of the first conductive feature. In an embodiment, the protection layer further comprises a sidewall portion contacting a sidewall of the first conductive feature. In an embodiment, the sidewall portion of the protection layer contacts an upper part of the sidewall of the first conductive feature to form a vertical interface, and a lower part of the sidewall of the first conductive feature is in contact with the second dielectric layer. In an embodiment, the top portion of the protection layer extends laterally beyond a sidewall of the first conductive feature, and wherein the sidewall of the first conductive feature is free from the protection layer. In an embodiment, the second dielectric layer contacts an entire top surface of the top portion of the protection layer.

In accordance with some embodiments of the present disclosure, a device includes a passivation layer; a redistribution line comprising a via portion extending into the passivation layer, and a line portion over and joining to the via portion, wherein the line portion comprises a seed layer over the passivation layer; a conductive material over the seed layer; and a protection layer comprising a top portion over and contacting the conductive material; and a first sidewall portion contacting a first sidewall of the conductive material; and a first dielectric layer extending on the first sidewall portion and the top portion of the protection layer. In an embodiment, the protection layer further comprises a second sidewall portion contacting a second sidewall of the conductive material, wherein a first bottom end of the first sidewall portion is lower than a second bottom end of the second sidewall portion. In an embodiment, the first sidewall portion is directly over an outer portion of the seed layer. In an embodiment, the protection layer is free from portions extending to a level lower than a top surface of the seed layer. In an embodiment, the first dielectric layer comprises a first top surface and a second top surface higher than the first top surface, and the device further comprises a second dielectric layer over and contacting both of the first top surface and the second top surface of the first dielectric layer, and wherein the second dielectric layer comprises a planar top surface extending directly over both of the first top surface and the second top surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first dielectric layer;
a redistribution line comprising a portion over the first dielectric layer, wherein the redistribution line comprises:
 a metal seed layer;
 a conductive feature over the metal seed layer, wherein the metal seed layer extends laterally beyond respective edges of the conductive feature; and
 a protection layer comprising:
  a top portion over and contacting a first top surface of the conductive feature, wherein the top portion also extends laterally beyond the respective edges of the conductive feature; and
a second dielectric layer extending on a sidewall and a second top surface of the redistribution line.

2. The device of claim 1, wherein the protection layer further comprises a sidewall portion on a sidewall of the conductive feature, wherein the sidewall portion is joined with the top portion of the protection layer.

3. The device of claim 2, wherein the sidewall portion of the protection layer is further joined to a top surface of the metal seed layer.

4. The device of claim 3, wherein an outer sidewall of the sidewall portion of the protection layer is vertically aligned to an outer edge of the metal seed layer.

5. The device of claim 1, wherein the second dielectric layer contacts the top portion of the protection layer to form a horizontal interface.

6. The device of claim 1, wherein the second dielectric layer is fully separated from the conductive feature by the protection layer.

7. The device of claim 1, wherein the conductive feature comprises copper, and the protection layer comprises a metal selected from the group consisting of Ni, Sn, Ag, Cr, Ti, Pt, and alloys thereof.

8. The device of claim 1 further comprising a via over and electrically coupling to the redistribution line, wherein the via penetrates through the second dielectric layer to contact a third top surface of the top portion of the protection layer.

9. The device of claim 1 further comprising a via over and electrically coupling to the redistribution line, wherein the via penetrates through the second dielectric layer and the top portion of the protection layer to contact the conductive feature.

10. A device comprising:
a passivation layer;
a redistribution line comprising a via portion extending into the passivation layer, and a line portion over and joining to the via portion, wherein the line portion comprises:
   a seed layer over the passivation layer, wherein the seed layer comprises first outer edges;
   a conductive material over the seed layer, wherein the conductive material comprises second outer edges; and
   a protection layer comprising:
      a top portion over and contacting the conductive material, wherein the top portion of the protection layer comprise third outer edges vertically offset from respective ones of the second outer edges; and
      a sidewall portion directly contacting one of the second outer edges of the conductive material; and
a first dielectric layer on the first sidewall portion and the top portion of the protection layer.

11. The device of claim 10, wherein the third outer edges of the top portion of the protection layer are also vertically offset from respective underlying ones of the first outer edges.

12. The device of claim 10, wherein the second outer edges are vertically aligned to respective underlying ones of the first outer edges.

13. The device of claim 10, wherein the top portion of the protection layer comprises an overhang portion extending beyond the respective ones of the second outer edges.

14. The device of claim 13, wherein the first dielectric layer comprises a portion contacting a bottom surface of the overhang portion to form an interface.

15. The device of claim 10, wherein the protection layer further comprises a sidewall portion contacting an upper part of one of the second outer edges of the conductive material.

16. The device of claim 15, wherein the first dielectric layer contacts a bottom part of the one of the second outer edges of the conductive material.

17. A device comprising:
a first dielectric layer;
a redistribution line comprising a portion over the first dielectric layer, wherein the redistribution line comprises:
   a metal seed layer;
   a conductive feature over the metal seed layer, wherein the metal seed layer extends laterally beyond respective edges of the first conductive feature; and
   a protection layer comprising:
      a top portion over and contacting a first top surface of the conductive feature, wherein the top portion also extends laterally beyond the respective edges of the conductive feature; and
      a sidewall portion contacting a sidewall of the conductive feature to form a vertical interface; and
a second dielectric layer contacting the redistribution line.

18. The device of claim 17, wherein the sidewall portion of the protection layer overlaps a part of the metal seed layer.

19. The device of claim 17, wherein the sidewall portion of the protection layer has a bottommost end higher than a topmost surface of the metal seed layer.

20. The device of claim 17 further comprising an under-bump metallurgy over and contacting the redistribution line.

* * * * *